(12) United States Patent
Takeshita et al.

(10) Patent No.: US 8,329,491 B2
(45) Date of Patent: Dec. 11, 2012

(54) MECHANICAL QUANTITY SENSOR AND METHOD OF MANUFACTURING THE SAME

(75) Inventors: Kiyokazu Takeshita, Tokyo (JP); Kazuhiko Aida, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 490 days.

(21) Appl. No.: 12/514,905

(22) PCT Filed: Nov. 15, 2007

(86) PCT No.: PCT/JP2007/072162
§ 371 (c)(1),
(2), (4) Date: May 14, 2009

(87) PCT Pub. No.: WO2008/062705
PCT Pub. Date: May 29, 2008

(65) Prior Publication Data
US 2010/0077859 A1    Apr. 1, 2010

(30) Foreign Application Priority Data

Nov. 20, 2006  (JP) .............................. P2006-313480

(51) Int. Cl.
*H01L 21/00*    (2006.01)
(52) U.S. Cl. ......................................... 438/50; 438/52
(58) Field of Classification Search ............. 438/50, 438/51, 52, 53, 456
See application file for complete search history.

(56) References Cited

U.S. PATENT DOCUMENTS

| | | | |
|---|---|---|---|
| 5,576,250 A | 11/1996 | Diem et al. | |
| 5,780,885 A | 7/1998 | Diem et al. | |
| 7,357,026 B2 | 4/2008 | Ozawa | |
| 2004/0231422 A1 | 11/2004 | Okada | |
| 2006/0179941 A1 | 8/2006 | Okada | |

FOREIGN PATENT DOCUMENTS

| | | |
|---|---|---|
| EP | 0 605 300 A1 | 7/1994 |
| JP | 7-98327 | 4/1995 |
| JP | 2001-280971 | 10/2001 |
| JP | 2002-350138 | 12/2002 |
| JP | 2003-347883 | 12/2003 |

(Continued)

OTHER PUBLICATIONS

International Preliminary Report on Patentability and Written Opinion issued by the International Bureau of WIPO for International Application No. PCT/JP2007/072162, on May 26, 2009.

(Continued)

*Primary Examiner* — Alexander Ghyka
*Assistant Examiner* — Reema Patel
(74) *Attorney, Agent, or Firm* — Finnegan, Henderson, Farabow, Garrett & Dunner, L.L.P.

(57) ABSTRACT

A mechanical quantity sensor includes a first structure having a fixed portion with an opening, a displaceable portion arranged in the opening and displaceable relative to the fixed portion, and a connection portion connecting the fixed portion and the displaceable portion, a second structure having a weight portion joined to the displaceable portion and a pedestal arranged surrounding the weight portion and joined to the fixed portion, the second structure being arranged and stacked on the first structure, a first base connected to the fixed portion and arranged and stacked on the first structure, and a second base connected to the pedestal and arranged and stacked on the second structure. The weight portion is adjusted in thickness after the first structure is made and before the second base and the second structure are joined.

8 Claims, 13 Drawing Sheets

FOREIGN PATENT DOCUMENTS

| JP | 2005-249454 | * | 9/2005 |
|---|---|---|---|
| JP | 2005-345294 | | 12/2005 |

OTHER PUBLICATIONS

Extended European Search Report/Supplementary European Search Report (EESR), issued by European Patent Office in an European patent application No. 07831892.0, dated Aug. 2, 2011 (7 pages).

International Search Report issued by Japanese Patent Office in International Application No. PCT/JP2007/072162, on Dec. 25, 2007.

Office Action issued by the Japanese Patent Office on May 1, 2012, for Japanese Patent Application No. 2008-545370, and English-language translation thereof.

* cited by examiner

MECHANICAL QUANTITY SENSOR AND METHOD OF MANUFACTURING THE SAME

TECHNICAL FIELD

The present invention relates to a mechanical quantity sensor detecting a mechanical quantity and a method of manufacturing the same.

BACKGROUND ART

There has been disclosed a technique of a mechanical quantity sensor, which is structured such that a transducer structure formed of a semiconductor is sandwiched by a pair of glass substrate and joined thereto, for detecting an acceleration and an angular velocity (see Patent Reference 1).

Patent Reference 1: JP-A 2002-350138 (KOKAI)

DISCLOSURE OF THE INVENTION

Generally, it is known that mechanical properties (resonance frequency, spring constant, and the like) of a mechanical quantity sensor depend on shapes and sizes of a weight (weight portion) and a beam (connection portion), and the like. Accordingly, designing of the mechanical quantity sensor satisfying a specification of desired mechanical properties is performed normally by presuming outer shape dimensions and a thickness of the beam, a thickness and an area of the weight, and so on, analyzing vibration, and repeating modification. Normally, the mechanical quantity sensor is manufactured based on such designing. Therefore, it has been necessary to prepare semiconductor substrates suitable for the thickness of the weight and so on in accordance with specifications of desired mechanical properties. It is not always easy to prepare semiconductor substrates having suitable thicknesses corresponding to the respective specifications.

Considering the above situation, an object of the present invention is to provide a mechanical quantity sensor capable of improving freedom of choice of the thickness of a semiconductor substrate to be prepared, and a method of manufacturing the same.

A mechanical quantity sensor according to an aspect of the present invention includes: a first structure having a fixed portion with an opening, a displaceable portion arranged in the opening and displaceable relative to the fixed portion, and a connection portion connecting the fixed portion and the displaceable portion, the first structure being integrally formed of a first semiconductor material in a plate shape; a second structure having a weight portion joined to the displaceable portion and a pedestal arranged surrounding the weight portion and joined to the fixed portion, the second structure being formed of a second semiconductor material and arranged and stacked on the first structure; a first base connected to the fixed portion, arranged and stacked on the first structure, and formed of an insulating material; a second base connected to the pedestal, arranged and stacked on the second structure, and formed of an insulating material; a vibration applier applying vibration in a stacking direction to the displaceable portion; and a displacement detector detecting a displacement of the displaceable portion, in which the weight portion is adjusted in thickness after the first structure is made and before the second base and the second structure are joined.

A method of manufacturing a mechanical quantity sensor according to an aspect of the present invention includes: forming a first structure having a fixed portion with an opening, a displaceable portion arranged in the opening and displaceable relative to the fixed portion, and a connection portion connecting the fixed portion and the displaceable portion by etching a first layer of a semiconductor substrate formed by sequentially stacking the first layer formed of a first semiconductor material, a second layer formed of an insulating material, and a third layer formed of a second semiconductor material; and adjusting a thickness of the third layer of the semiconductor substrate in which the first structure is made.

EXPLANATION OF NUMERALS 100, 200 . . . mechanical quantity sensor, 110 . . . first structure, 111 . . . fixed portion, 111a . . . frame portion, 111b, 111c . . . projecting portion, 112 (112a-112e) . . . displaceable portion, 113 (113a-113d) . . . connection portion, 114 (114a-114j) . . . block upper layer portion, 115 (115a-115d) . . . opening, 120, 121, 122, 123 . . . joining part, 130, 230 . . . second structure, 131, 231 . . . pedestal, 131a, 231a . . . frame portion, 131b-131d, 231b-231d . . . projecting portion, 132 (132a-133e), 232 (232a-232e) . . . weight portion, 133 . . . opening, 134 (134a-134j), 234 (234a-234j) . . . block lower layer portion, 135, 235 . . . pocket, 140 . . . first base, 141 . . . frame portion, 142 . . . bottom plate portion, 143 . . . recessed portion, 144a . . . driving electrode, 144b-144e . . . detection electrode, 150 . . . second base, 154a . . . driving electrode, 154b-154e . . . detection electrode, 160-162 . . . conduction portion, 10 . . . gap, 11 . . . weight-shaped through hole, L1, L2, L4-L11 . . . wiring layer, T1-T11 . . . wiring terminal, E1 . . . driving electrode, detection electrode

BEST MODE FOR CARRYING OUT THE INVENTION

Hereinafter, embodiments of the present invention will be described in detail with reference to the drawings.

First Embodiment

Figure 1:
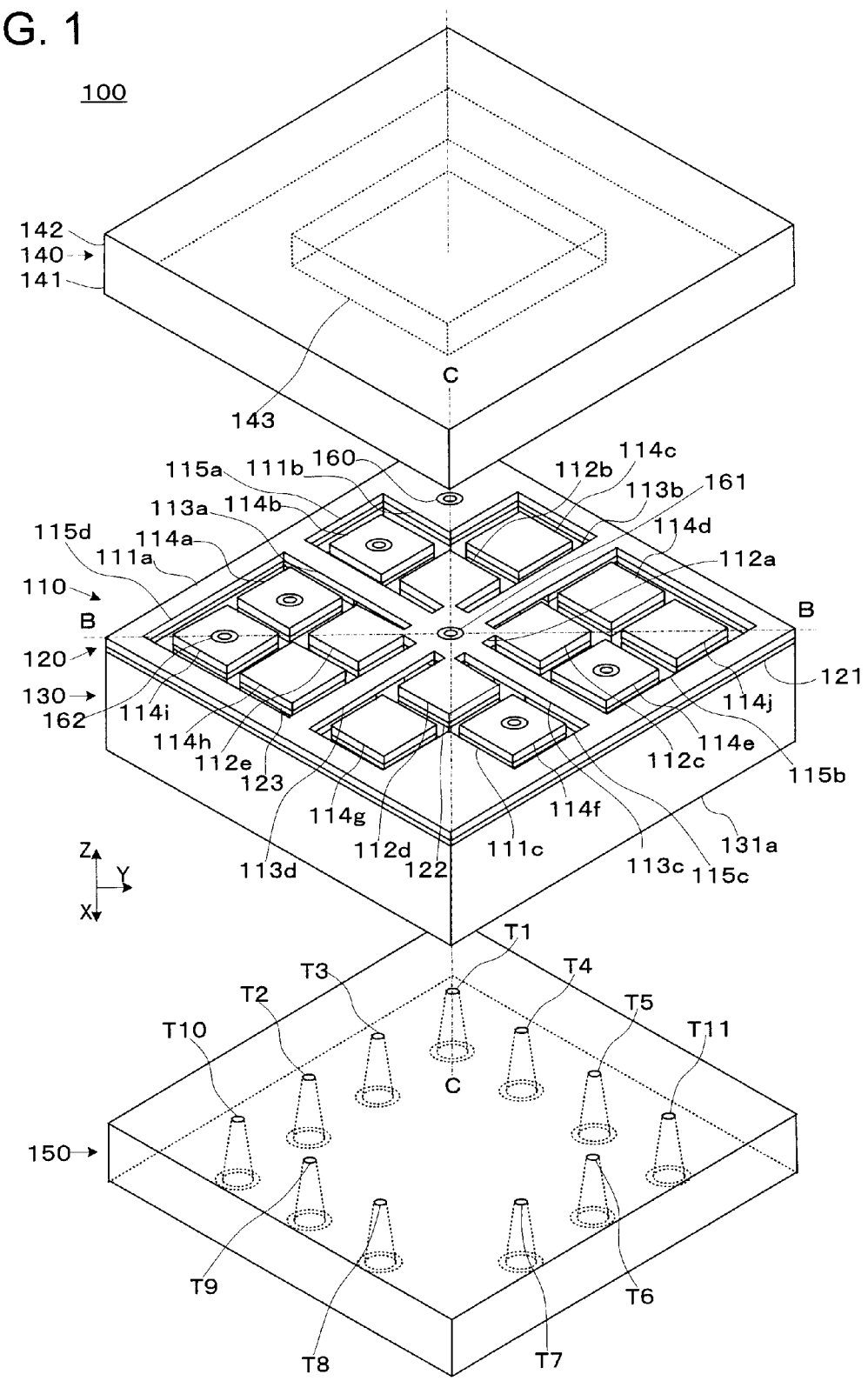
FIG. 1 is an exploded perspective view showing a state that a mechanical quantity sensor according to a first embodiment of the present invention is disassembled.

FIG. 1 is an exploded perspective view showing a state that a mechanical quantity sensor 100 is disassembled. The mechanical quantity sensor 100 has a first structure 110, a joining part 120, and a second structure 130 which are stacked one another, and a first base 140 and a second base 150.

Figure 2:
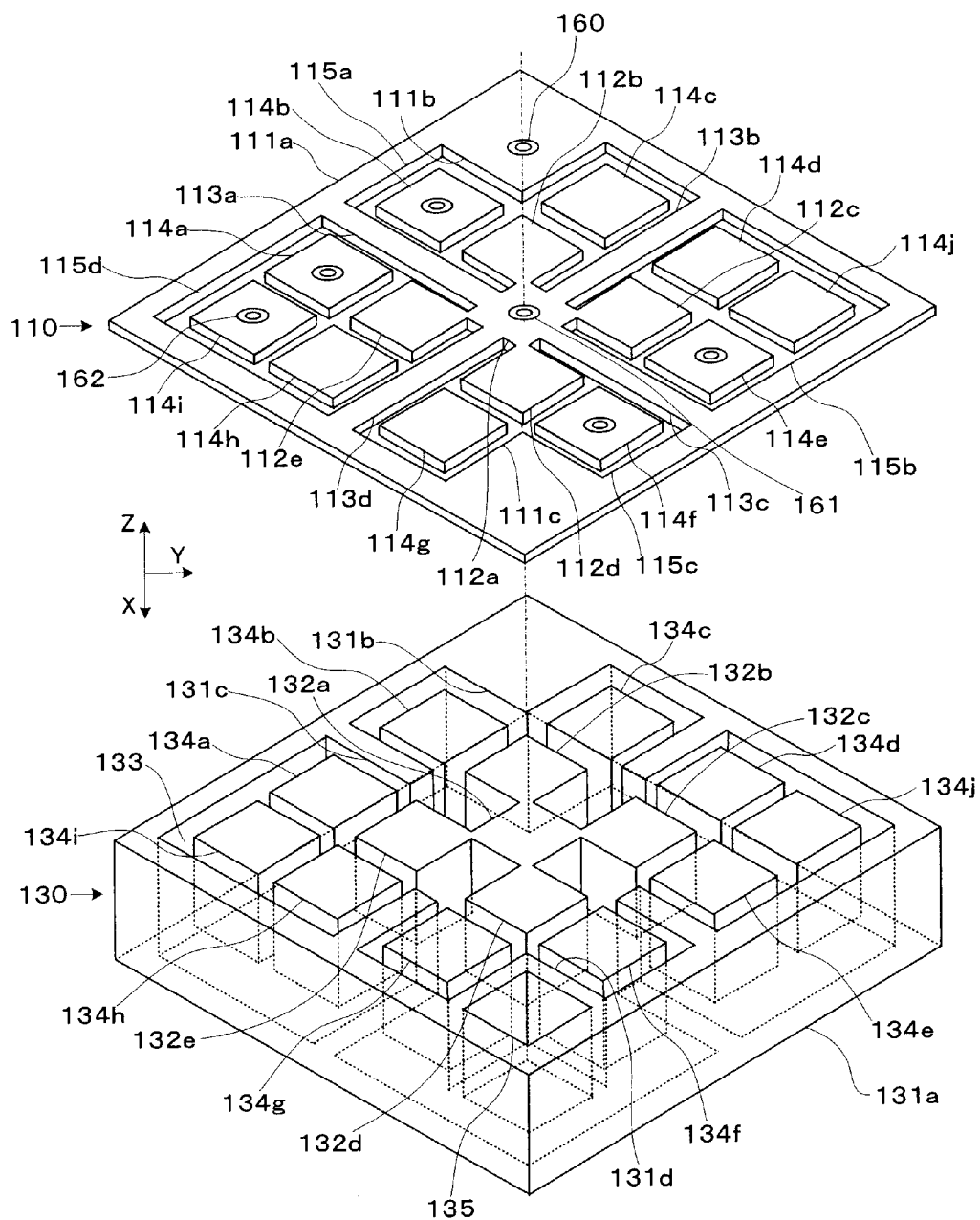
FIG. 2 is an exploded perspective view showing a state that the mechanical quantity sensor in FIG. 1 is disassembled.
Figure 3:
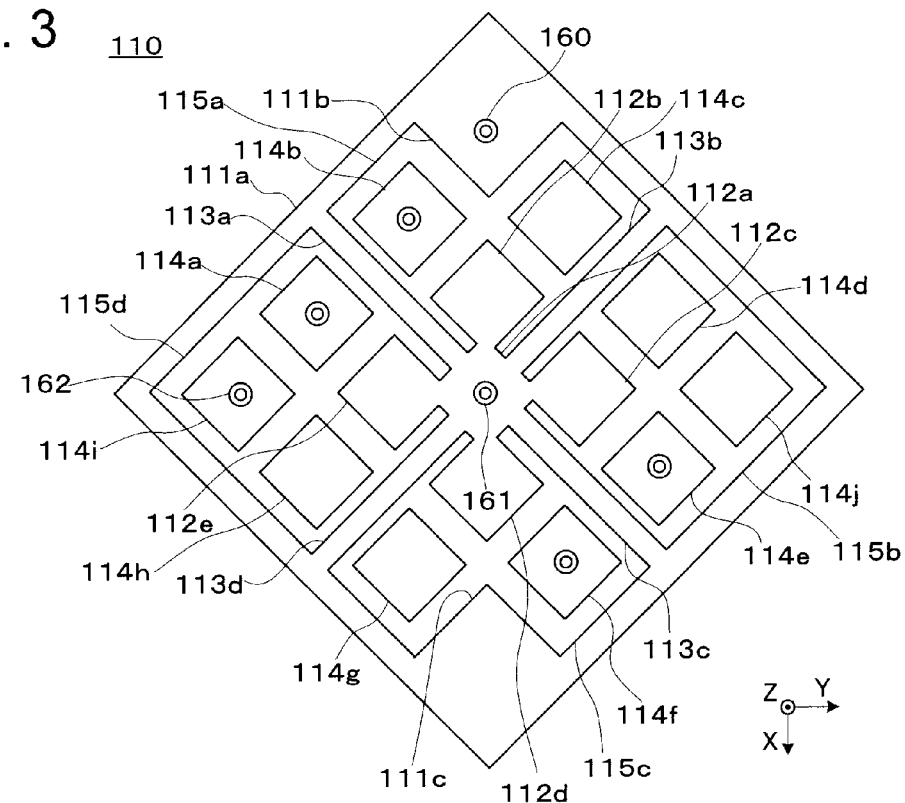
FIG. 3 is a top view of a first structure.
Figure 4:
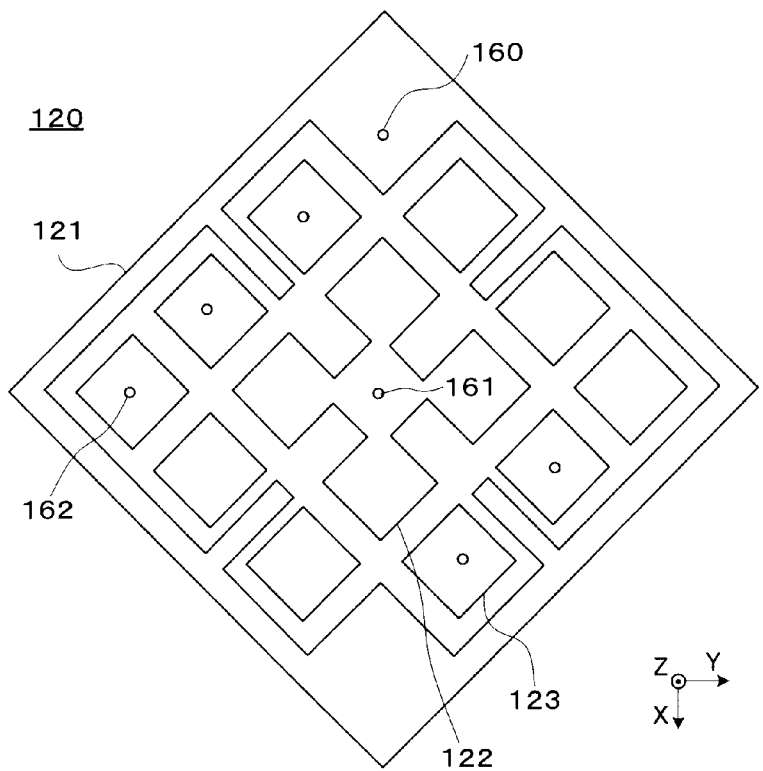
FIG. 4 is a top view of a joining part.
Figure 5:
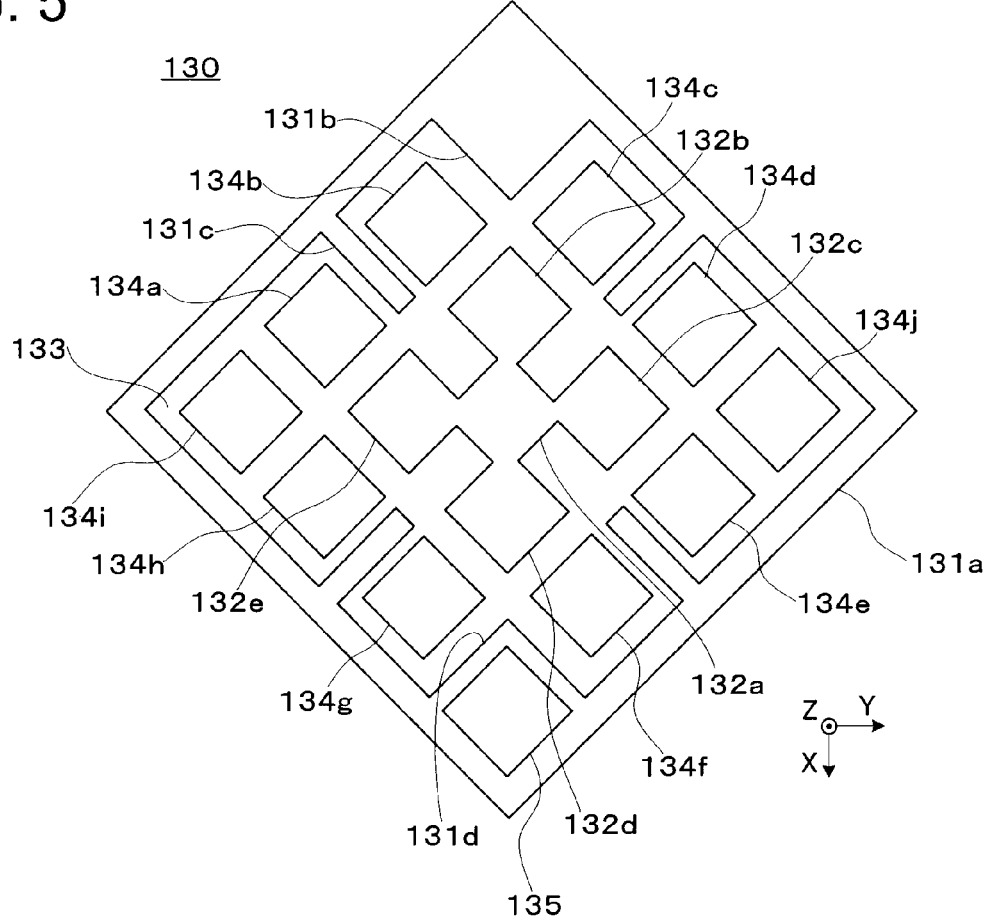
FIG. 5 is a top view of a second structure.
Figure 6:
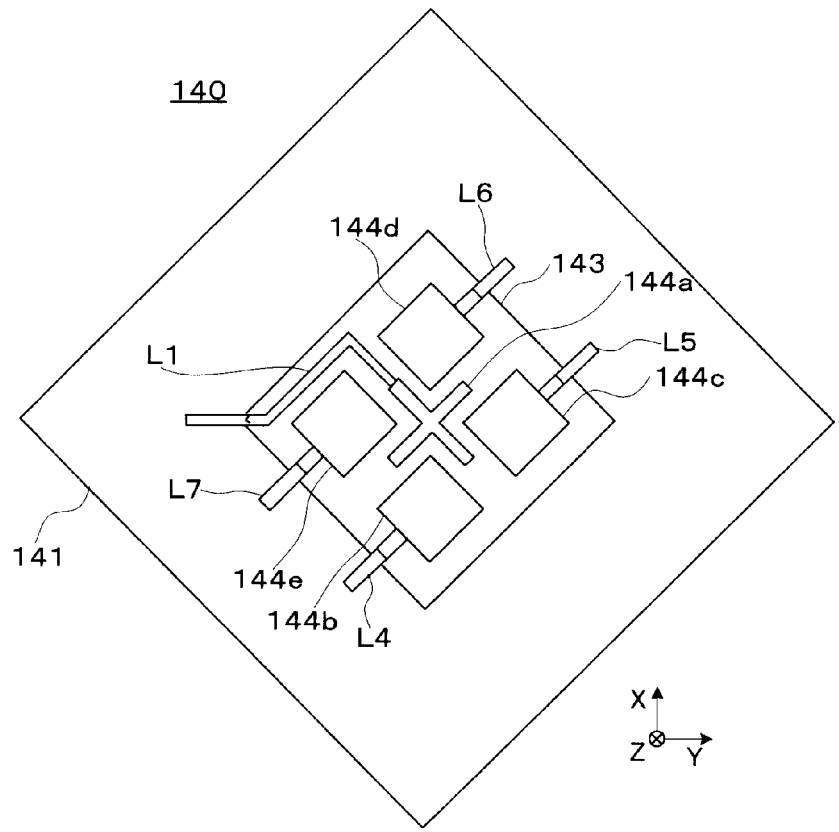
FIG. 6 is a bottom view of a first base.
Figure 7:
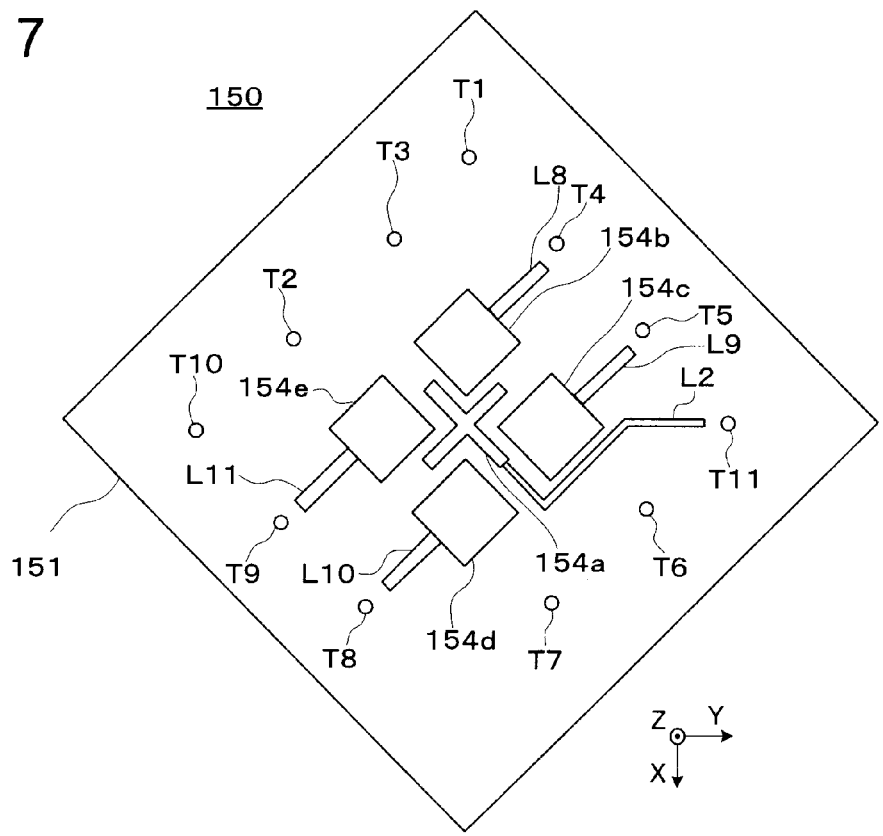
FIG. 7 is a top view of a second base.
Figure 8:
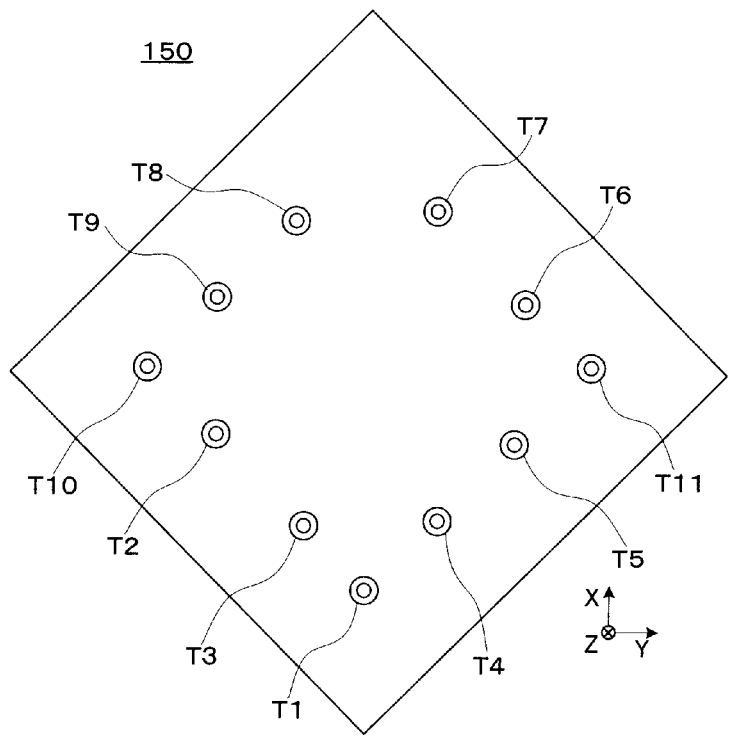
FIG. 8 is a bottom view of the second base.
Figure 9:
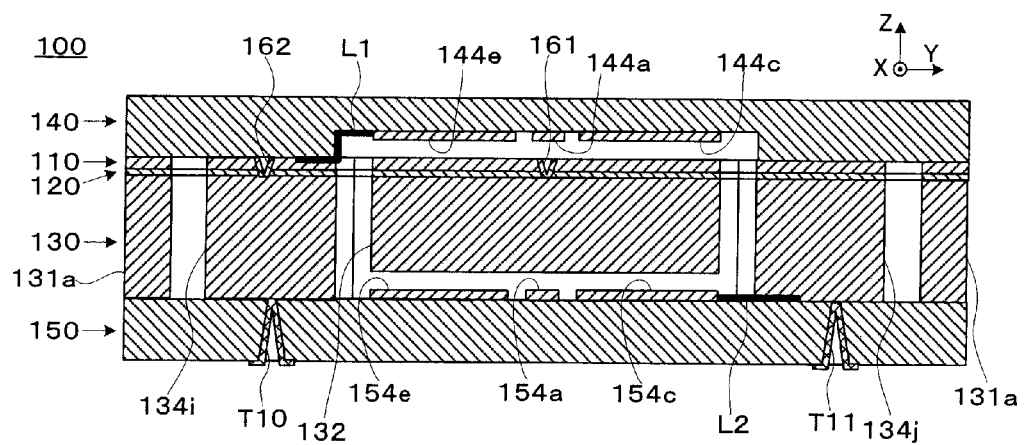
FIG. 9 is a cross-sectional view taken along a line B-B in FIG. 1.
Figure 10:
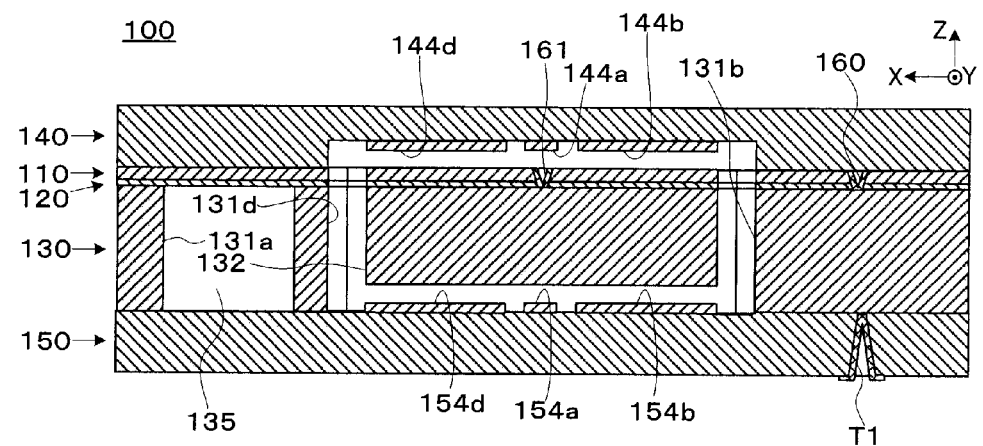
FIG. 10 is a cross-sectional view taken along a line C-C in FIG. 1.

FIG. 2 is an exploded perspective view showing a state that part (first structure 110 and second structure 130) of the mechanical quantity sensor 100 is further disassembled. FIGS. 3, 4, 5 are top views of the first structure 110, the joining part 120, and the second structure 130, respectively. FIG. 6, FIG. 7, FIG. 8 are a bottom view of the first base 140, a top view of the second base 150, and a bottom view of the second base 150, respectively. FIG. 9 and FIG. 10 are cross-sectional views of the mechanical quantity sensor 100 taken along a line B-B and a line C-C of FIG. 1.

The mechanical quantity sensor 100 functions by itself or in combination with a circuit board (for example, mounted on a board) as an electronic component. The mechanical quantity sensor 100 as an electronic component can be mounted in a game machine, a mobile terminal (for example, a cellular phone), or the like. In addition, the mechanical quantity sensor 100 and the circuit board (active elements such as IC and wiring terminals on the circuit board) are connected electrically by wire bonding, flip-chipping, or the like.

The mechanical quantity sensor 100 is capable of measuring one or both of an acceleration $\alpha$ and an angular velocity $\omega$. That is, a mechanical quantity means one or both of the acceleration $\alpha$ and the angular velocity $\omega$. Accelerations $\alpha x$, $\alpha y$, $\alpha z$ can be measured by detecting displacements of a displaceable portion 112 (which will be described later) caused by forces F0x, F0y, F0z in X, Y, Z-axis directions, respectively. Further, angular velocities $\omega x$, $\omega y$ in X, Y-axis directions respectively can be measured by vibrating the displaceable portion 112 in the Z-axis direction and detecting displacements of the displaceable portion 112 caused by Coriolis forces Fy, Fx in Y, X-axis directions, respectively. In this manner, the mechanical quantity sensor 100 is capable of measuring the accelerations $\alpha x$, $\alpha y$, $\alpha z$ in three axes and the angular velocities $\omega x$, $\omega y$ in two axes. Note that details of this will be described later.

The first structure 110, the joining part 120, the second structure 130, the first base 140, and the second base 150 each have a substantially square outer periphery with each side being 5 mm for example, and have heights of, for example, 20 μm, 2 μm, 600 μm, 500 μm, and 500 μm, respectively.

The first structure 110, the joining part 120, and the second structure 130 can be formed of silicon, silicon oxide, and silicon, respectively, and the mechanical quantity sensor 100 can be manufactured using an SOI (Silicon On Insulator) substrate forming a three-layer structure of silicon/silicon oxide/silicon. For the silicon forming the first structure 110 and the second structure 130, it is preferable to use a conductive material containing impurities, for example boron or the like, in its entirety. As will be described later, use of silicon containing impurities for forming the first structure 110 and the second structure 130 allows to simplify wiring of the mechanical quantity sensor 100. In this embodiment, silicon containing impurities is used for the first structure 110 and the second structure 130.

Further, the first base 140 and the second base 150 can each be formed of a glass material.

The first structure 110 has a substantially square outer shape, and is made up of a fixed portion 111 (111a to 111c), a displaceable portion 112 (112a to 112e), a connection portion 113 (113a to 113d), and a block upper layer portion 114 (114a to 114j). The first structure 110 can be made by etching a film of a semiconductor material and forming openings 114a to 114d and block upper layer portions 114a to 114j.

The fixed portion 111 can be separated into a frame portion 111a and projecting portions 111b, 111c. The frame portion 111a is a frame-shaped substrate with an outer periphery and an inner periphery both being a substantially square. The projecting portion 111b is a substantially square substrate, arranged at a corner portion on the inner periphery of the frame portion 111a and projecting toward the displaceable portion 112b (in a 0° direction when an X direction of the X-Y plane is)0°. The projecting portion 111c is a substantially square substrate, arranged at a corner portion on the inner periphery of the frame portion 111a and projecting toward the displaceable portion 112d (in a 180° direction when an X direction of the X-Y plane is) 0°). The frame portion 111a and the projecting portions 111b, 111c are formed integrally.

The displaceable portion 112 is made up of displaceable portions 112a to 112e. The displaceable portion 112a is a substrate having a substantially square outer periphery and is arranged in the vicinity of the center of an opening of the fixed portion 111. The displaceable portions 112b to 112e are substrates each having a substantially rectangular outer periphery and are connected and arranged so as to surround the displaceable portion 112a from four directions (X-axis positive direction, X-axis negative direction, Y-axis positive direction, and Y-axis negative direction). The displaceable portions 112a to 112e are joined respectively to weight portions 132a to 132e which will be described later by the joining part 120, and are displaced integrally relative to the fixed portion 111.

An upper face of the displaceable portion 112a functions as a driving electrode E1 (which will be described later). The driving electrode E1 on the upper face of the displaceable portion 112a capacitively couples to a driving electrode 144a, which will be described later, disposed on a lower face of the first base 140, and the displaceable portion 112 is vibrated in the Z-axis direction by voltage applied therebetween. Note that details of this driving will be described later.

Upper faces of the displaceable portions 112b to 112e each function as a detection electrode E1 (which will be described later) detecting displacements in the X-axis and Y-axis directions of the displaceable portion 112. The detection electrodes on the upper faces of the displaceable portions 112b to 112e capacitively couple respectively to detection electrodes 144b to 144e, which will be described later, disposed on a lower face of the first base 140 (the alphabets b to e of the displaceable portions 112 correspond to the alphabets b to e of the detection electrodes 144 in order respectively). Note that details of this detection will be described later.

The connection portions 113a to 113d are substantially rectangular substrates connecting the fixed portion 111 and the displaceable portion 112a in four directions (45°, 135°, 225°, 315° directions when the X direction of the X-Y plane is 0°).

Areas of the connection portions 113a to 113d close to the frame portion 111a are joined by the joining part 120 to projecting portions 131c of a pedestal 131 (which will be described later). For other areas of the connection portions 113a to 113d, that is, areas close to the displaceable portion 112a, the projecting portions 131c are not formed in the corresponding areas, and these areas have a small thickness and hence have flexibility. The reason that the areas of the connection portions 113a to 113d close to the frame portion 111a are joined to the projecting portions 131c is to prevent damage to the connection portions 113a to 113d by large deflection.

The connection portions 113a to 113d function as deflectable beams. Deflection of the connection portions 113a to 113d can displace the displaceable portion 112 relative to the fixed portion 111. Specifically, the displaceable portion 112 is displaced linearly in a Z positive direction and a Z negative direction relative to the fixed portion 111. Further, the displaceable portion 112 is capable of rotating positively or negatively with the X-axis and Y-axis being rotation axes, relative to the fixed portion 111. That is, the "displacement" mentioned here can include both movement and rotation (movement in the Z-axis direction and rotation about the X, Y axes).

The block upper layer portion 114 is made up of block upper layer portions 114a to 114j. The block upper layer portions 114a to 114j are substantially square substrates and are arranged along the inner periphery of the fixed portion 111 so as to surround the displaceable portion 112 from its periphery.

The block upper layer portions 114h, 114a have end faces facing end faces of the displaceable portion 112e, and the block upper layer portions 114b, 114c have end faces facing end faces of the displaceable portion 112b. The block upper layer portions 114d, 114e have end faces facing end faces of the displaceable portion 112c, and the block upper layer portions 114f, 114g have end faces facing end faces of the displaceable portion 112d. As shown in FIG. 1, the block upper layer portions 114a to 114h each have the end face facing one of eight end faces of the displaceable portion 112, and are arranged clockwise in alphabetical order. The block upper layer portion 114i and the block upper layer portion 114j are arranged in 90°, 270° directions when the X direction of the X-Y plane is 0°.

The block upper layer portions 114a to 114h are joined respectively to block lower layer portions 134a to 134h, which will be described later, by the joining part 120 (the alphabets a to h of the block upper layer portions 114 correspond to the alphabets a to h of the block lower layer portions 134 in order respectively).

The block upper layer portions 114i, 114j are joined respectively to block lower layer portions 134i, 134j, which will be described later, by the joining part 120, and are used for the purpose of wiring for vibrating the displaceable portion 112 in the Z-axis direction. Note that details of this will be described later.

The second structure 130 has a substantially square outer shape, and is made up of a pedestal 131 (131a to 131d), a weight portion 132 (132a to 132e), and a block lower layer portion 134 (134a to 134j). The second structure 130 can be made by etching a substrate of a semiconductor material to form an opening 133, block lower layer portions 134a to 134j, and a pocket 135 (which will be described later). In addition, the pedestal 131 and the block lower layer portions 134a to 134j are substantially equal in height, and the weight portion 132 is lower in height than the pedestal 131 and the block lower layer portions 134a to 134j. This is for securing a space (gap) between the weight portion 132 and the second base 150 for allowing the weight portion 132 to be displaced. The pedestal 131, the block lower layer portions 134a to 134j, and the weight portion 132 are arranged separately from each other.

The pedestal 131 can be separated into a frame portion 131a and projecting portions 131b to 131d.

The frame portion 131a is a frame-shaped substrate with an outer periphery and an inner periphery both being a substantially square, and has a shape corresponding to the frame portion 111a of the fixed portion 111.

The projecting portion 131b is a substantially square substrate, arranged at a corner portion on the inner periphery of the frame portion 131a and projecting toward the weight portion 132b (in a 0° direction when the X direction of the X-Y plane is)0°), and has a shape corresponding to the projecting portion 111b of the fixed portion 111.

The projecting portions 131c are four substantially rectangular substrates, projecting toward the weight portion 132a from the frame portion 131a in 45°, 135°, 225°, 315° directions respectively when the X direction of the X-Y plane is 0°, and having one ends connected to the frame portion 131a of the pedestal 131 and the other ends arranged separately from the weight portion 132a. The projecting portions 131c are formed in substantially half areas on the frame portion 131a side in the areas corresponding to the connection portions 113a to 113d, and are not formed in other areas, that is, substantially half areas on the weight portion 132 side.

The projecting portion 131d is a substantially square substrate, arranged at a corner portion on the inner periphery of the frame portion 131a and projecting toward the weight portion 132d (in the 180° direction when X direction of the X-Y plane is 0°), in which a pocket 135 (opening) penetrating through a front face and a rear face of this substrate is formed, and is joined to the projecting portion 111c of the fixed portion 111.

The pocket 135 is a rectangular parallelepiped space for example, in which a getter material for maintaining a high vacuum is placed. One opening end of the pocket 135 is covered by the joining part 120. Most part of the other opening end of the pocket 135 is covered by the second base 150, but a part thereof near the weight portion 132 is not covered. This other opening end and the opening 133 in which the weight portion 132 and so on are formed communicate partly with each other (not shown). The getter material absorbs a residue gas for the purpose of increasing the degree of vacuum in the mechanical quantity sensor 100 which is vacuum sealed, and can be formed of, for example, an alloy containing zirconium as a main constituent, or the like.

The frame portion 131a and the projecting portions 131b to 131d are formed integrally.

The pedestal 131 is connected to the fixed portion 111 and predetermined areas of the connection portions 113a to 113d by the joining part 120.

The weight portion 132 functions as a heavy weight or an operating body having a mass and receiving the force F0 and the Coriolis force F caused by the acceleration α and the angular velocity ω respectively. That is, when the acceleration α and the angular velocity ω are applied, the force F0 and the Coriolis force F act on the center of gravity of the weight portion 132.

The weight portion 132 is separated into weight portions 132a to 132e having a rectangular parallelepiped shape. The weight portions 132b to 132e are connected from four directions to the weight portion 132a arranged in the center, and are displaceable (movable, rotatable) integrally as a whole. That is, the weight portion 132a functions as a connection portion connecting the weight portions 132b to 132e.

The weight portions 132a to 132e have substantially square cross-sectional shapes corresponding to the displaceable portions 112a to 112e, respectively, and are joined to the displaceable portions 112a to 112e by the joining part 120. The displaceable portion 112 is displaced according to the force F0 and the Coriolis force F applied to the weight portion 132, and consequently, it becomes possible to measure the acceleration α and the angular velocity w.

The reason that the weight portion 132 is made up of the weight portions 132a to 132e is to achieve both reduction in size and increase in sensitivity of the mechanical quantity sensor 100. When the mechanical quantity sensor 100 is reduced in size (reduced in capacity), the capacity of the weight portion 132 decreases, and its mass decreases, resulting in decreased sensitivity to the angular velocity. Dispersed arrangement of the weight portions 132b to 132e which does not hinder deflections of the connection portions 113a to 113d assures the mass of the weight portions 132. Consequently, the reduction in size and the increase in sensitivity of the mechanical quantity sensor 100 are both achieved.

The weight portion 132 is formed by adjusting the thickness of the semiconductor material in the formation area of the second structure 130 (that is, including the formation area of the weight portion 132) to be thinner, in the middle of the manufacturing process, specifically, after the first structure 110 is formed and before the second base 150 and the second structure 130 are joined.

Since the weight portion 132 is adjusted in thickness in the middle of the manufacturing process of the mechanical quantity sensor 100, it is possible to improve freedom of choice of the thickness of the semiconductor substrate prepared for manufacturing the mechanical quantity sensor 100.

Further, since the weight portion 132 is adjusted in thickness in the middle of the manufacturing process of the mechanical quantity sensor 100, it is possible to make and stock the same semi-manufactured products for the mechanical quantity sensor 100 (products in the middle of a manufacturing process before reaching final products), irrespective of the specification of demanded mechanical properties such as a resonance frequency. This is because it is possible to manufacture the mechanical quantity sensor 100 with a specification of demanded mechanical properties from the semi-manufactured product, by adjusting the thickness of the weight portion 132 affecting the mechanical properties in the middle of the manufacturing process of the mechanical quantity sensor 100. Since the same semi-manufactured products can thus be made and stocked irrespective of specification of mechanical properties of the final product (mechanical quantity sensor 100), mass-production effect thereof enables to reduce the manufacturing cost of the mechanical quantity sensor 100. Note that details of making and stocking the semi-manufactured products will be described later.

An example of the adjustment of the thickness of the weight portion 132 is thinning by polishing the semiconductor material layer in the area where the second structure 130 is formed.

Although not particularly limited, the thickness of the weight portion 132 is preferred to be 50 μm or larger. When the thickness of the weight portion 132 is smaller than 50 μm, there is a fear of damaging the semiconductor substrate when polishing the semiconductor material layer in the area where the weight portion 132 is formed.

The thickness of the weight portion 132 is set appropriately according to the specification of mechanical properties demanded for the mechanical quantity sensor 100.

A rear face of the weight portion 132a functions as a driving electrode E1 (which will be described later). This driving electrode E1 on the rear face of the weight portion 132a capacitively couples to a driving electrode 154a, which will be described later, disposed on an upper face of the second base 150, and the displaceable portion 112 is vibrated in the Z-axis direction by voltage applied therebetween. Note that details of this driving will be described later.

Rear faces of the weight portions 132b to 132e each function as a detection electrode E1 (which will be described later) detecting a displacement of the displaceable portion 112 in the X-axis and Y-axis directions. The detection electrodes E1 on the rear faces of the weight portions 132b to 132e capacitively couple respectively to detection electrodes 154b to 154e, which will be described later, disposed on the upper face of the second base 150 (the alphabets b to e of the weight portion 132 correspond to the alphabets b to e of the detection electrodes 154 in order respectively). Note that details of this detection will be described later.

The block lower layer portions 134a to 134j have substantially square cross-sectional shapes corresponding to those of the block upper layer portions 114a to 114j, respectively, and are joined to the block upper layer portions 114a to 114j by the joining part 120. Blocks made by joining the block upper layer portions 114a to 114h and the block lower layer portions 134a to 134h are hereinafter referred to as "blocks a to h", respectively. The blocks a to h are used for the purpose of wirings to supply power to driving electrodes 144b to 144e, 154b to 154e, respectively. Blocks made by joining the block upper layer portions 114i, 114j and the block lower layer portions 134i, 134j, respectively (hereinafter referred to as "blocks i, j" respectively), are used for the purpose of wirings for vibrating the displaceable portion 112 in the Z-axis direction. Note that details of this will be described later.

The joining part 120 connects the first, second structures 110, 130 as already described. The joining part 120 is separated into a joining part 121 connecting the predetermined areas of the connection portions 113 and the fixed portion 111 to the pedestal 131, a joining part 122 (122a to 122e) connecting the displaceable portions 112a to 112e to the weight portions 132a to 133e, and a joining part 123 (123a to 123j) connecting the block upper layer portions 114a to 114j to the block lower layer portions 134a to 134j. Other than these portions, the joining part 120 does not connect the first and second structures 110, 130. This is for allowing the connection portions 113a to 113d to deflect and the weight portion 132 to be displaced.

In addition, the joining parts 121, 122, 123 can be formed by etching a silicon oxide film.

Conduction portions 160 to 162 are formed for establishing conduction of the first structure 110 and the second structure 130 at necessary portions.

The conduction portion 160 establishes conduction between the fixed portion 111 and the pedestal 131, and penetrates the projecting portion 111b of the fixed portion 111 and the joining part 121.

The conduction portion 161 establishes conduction between the displaceable portion 112 and the weight portion 132, and penetrates the displaceable portion 112a and the joining part 122.

The conduction portions 162 establish conduction between the block upper layer portions 114a, 114b, 114e, 114f, 114i and the block lower layer portions 134a, 134b, 134e, 134f, 134i respectively, and penetrate the block upper layer portions 114a, 114b, 114e, 114f, 114i and the joining part 123 respectively.

The conduction portions 160 to 162 are made by forming, for example, metal layers of Al or the like on, for example, edges, wall faces and bottom portions of through holes. In addition, although shapes of the through holes are not particularly limited, the through holes of the conduction portions 160 to 162 are preferred to be formed in truncated conical shapes because they allow to form metal layers effectively by sputtering or the like of Al or the like.

The first base 140 is formed of, for example, a glass material, has a substantially parallelepiped outer shape, and has a frame portion 141 and a bottom plate portion 142. The frame portion 141 and the bottom plate portion 142 can be made by forming recessed portion 143 in a substantially rectangular parallelepiped shape (for example, 2.5 mm square and 5 μm deep) in a substrate.

The frame portion 141 has a substrate shape that is a frame shape with an outer periphery and an inner periphery both being a substantially square. The outer periphery of the frame portion 141 matches the outer periphery of the fixed portion 111, and the inner periphery of the frame portion 141 is smaller than the inner periphery of the fixed portion 111.

The bottom plate portion 142 has a substantially square substrate shape having an outer periphery that is substantially the same as that of the frame portion 141.

The reason that the recessed portion 143 is formed in the first base 140 is to secure a space for allowing the displaceable portion 112 to be displaced. The first structure 110 excluding the displaceable portion 112, that is, the fixed portion 111 and the block upper layer portions 114a to 114j are joined to the first base 140 by anodic bonding for example.

On the bottom plate portion 142 (on a rear face of the first base 140), a driving electrode 144a and detection electrodes 144b to 144e are arranged so as to face the displaceable portion 112. The driving electrode 144a and the detection electrodes 144b to 144e can all be formed of a conductive material. The driving electrode 144a is cross shaped for example and is formed in the vicinity of the center of the recessed portion 143 so as to face the displaceable portion 112a. The detection electrodes 144b to 144e each have a substantially square shape, surrounding the driving electrode 144a from four directions (the X-axis positive direction, the X-axis negative direction, the Y-axis positive direction, and the Y-axis negative direction), and are arranged to face the displaceable portions 112b to 112e in order respectively. The driving electrode 144a and the detection electrodes 144b to 144e are separated from each other.

A wiring layer L1 electrically connected to an upper face of the block upper layer portion 114 is connected to the driving electrode 144a. A wiring layer L4 electrically connected to an upper face of the block upper layer portion 114b is connected to the detection electrode 144b. A wiring layer L5 electrically connected to an upper face of the block upper layer portion 114e is connected to the detection electrode 144c. A wiring layer L6 electrically connected to an upper face of the block upper layer portion 114f is connected to the detection electrode 144d. A wiring layer L7 electrically connected to an upper face of the block upper layer portion 114a is connected to the detection electrode 144e.

As a constituent material for the driving electrode 144a, the detection electrodes 144b to 144e, and the wiring layers L1, L4 to L7, Al containing Nd can be used for example. Use of the Al containing Nd (Nd content of 1.5 at % to 10 at %) for the driving electrode 144a and the detection electrodes 144b to 144e allows to suppress formation of hillocks on the driving electrode 144a and the detection electrodes 144b to 144e in a heat treatment process (anodic bonding of the first base 140 or the second base 150 and activation of the getter material) which will be described later. The hillocks mentioned here are, for example, hemispheric projections. Thus, dimensional accuracy can be increased for a distance between the driving electrode 144a and the driving electrode E1 (which capacitively couples to the driving electrode 144a) formed on the upper face of the displaceable portion 112a and distances between the detection electrodes 144b to 144e and the detection electrodes E1 (which capacitively couple to the detection electrodes 144b to 144e respectively) formed on the upper faces of the displaceable portions 112b to 112e.

The second base 150 is made of a glass material for example, and has a substantially square substrate shape. The second structure 130 excluding the weight portion 132, that is, the pedestal 131 and the block lower layer portions 134a to 134j are joined to the second base 150 by anodic bonding for example. The weight portion 132 is lower in height than the pedestal 131 and the block lower layer portions 134a to 134j, and thus is not joined to the second base 150. This is for securing a space (gap) between the weight portion 132 and the second base 150 for allowing the weight portion 132 to be displaced.

On the upper face of the second base 150, a driving electrode 154a and detection electrodes 154b to 154e are arranged so as to face the weight portion 132. The driving electrode 154a and the detection electrodes 154b to 154e can all be formed of a conductive material. The driving electrode 154a is cross shaped for example and is formed in the vicinity of the center of the upper face of the second base 150 so as to face the weight portion 132a. The detection electrodes 154b to 154e each have a substantially square shape, surrounding the driving electrode 154a from four directions (the X-axis positive direction, the X-axis negative direction, the Y-axis positive direction, and the Y-axis negative direction), and are arranged to face the weight portions 132b to 132e in order respectively. The driving electrode 154a and the detection electrodes 154b to 154e are separated from each other.

A wiring layer L2 electrically connected to a rear face of the block lower layer portion 134j is connected to the driving electrode 154a.

A wiring layer L8 electrically connected to a rear face of the block lower layer portion 134c is connected to the detection electrode 154b. A wiring layer L9 electrically connected to a rear face of the block lower layer portion 134d is connected to the detection electrode 154c. A wiring layer L10 electrically connected to a rear face of the block lower layer portion 134g is connected to the detection electrode 154d. A wiring layer L11 electrically connected to a rear face of the block lower layer portion 134h is connected to the detection electrode 154e.

As a constituent material for the driving electrode 154a, the detection electrodes 154b to 154e, and the wiring layers L2, L8 to L11, Al containing Nd can be used for example. Use of the Al containing Nd (Nd content of 1.5 at % to 10 at %) for the driving electrode 154a and the detection electrodes 154b to 154e allows to suppress formation of hillocks on the driving electrodes 154a and the detection electrodes 154b to 154e in a heat treatment process (anodic bonding of the second base 150 and activation of the getter material), which will be described later. Thus, dimensional accuracy can be increased for a distance between the driving electrode 154a and the driving electrode E1 (which capacitively couples to the driving electrode 154a) formed on the rear face of the weight portion 132a and distances between the detection electrodes 154b to 154e and the detection electrodes E1 (which capacitively couple to the detection electrodes 154b to 154e respectively) formed on the rear faces of the weight portions 132b to 132e.

Wiring terminals T (T1 to T11) penetrating the second base 150 is provided in the second base 150, which allows electrical connection from the outside of the mechanical quantity sensor 100 to the driving electrodes 144a, 154a, the detection electrodes 144b to 144e, 154b to 154e.

An upper end of the wiring terminal T1 is connected to a rear face of the projecting portion 131b of the pedestal 131. The wiring terminals T2 to T9 are connected to the rear faces of the block lower layer portions 134a to 134h, respectively (the numerical order of T2 to T9 of the wiring terminals T2 to T9 corresponds to the alphabetical order of 134a to 134h of the block lower layer portions 134a to 134h, respectively). The wiring terminals T10, T11 are connected to the rear faces of the block lower layer portions 134i, 134j, respectively.

As shown in FIG. 9 and FIG. 10, the wiring terminals T are made by forming, for example, metal films of Al or the like on, for example, edges, wall faces and bottom portions of truncated conical through holes, and has structures similar to the conduction portions 160 to 162. The wiring terminals T can be used as connection terminals for connection to an external circuit by wire bonding for example.

Note that in FIG. 1 to FIG. 10, the second base 150 is illustrated to be arranged on a lower side for making it easy to see the first structure 110, the joining part 120, and the second structure 130. When the wiring terminals T and an external circuit are connected by wire bonding for example, the second base 150 of the mechanical quantity sensor 100 can be arranged on an upper side for example, so as to facilitate the connection.

(Operation and Wiring of the Mechanical Quantity Sensor 100)

The wiring and electrodes of the mechanical quantity sensor 100 will be described.

Figure 11:
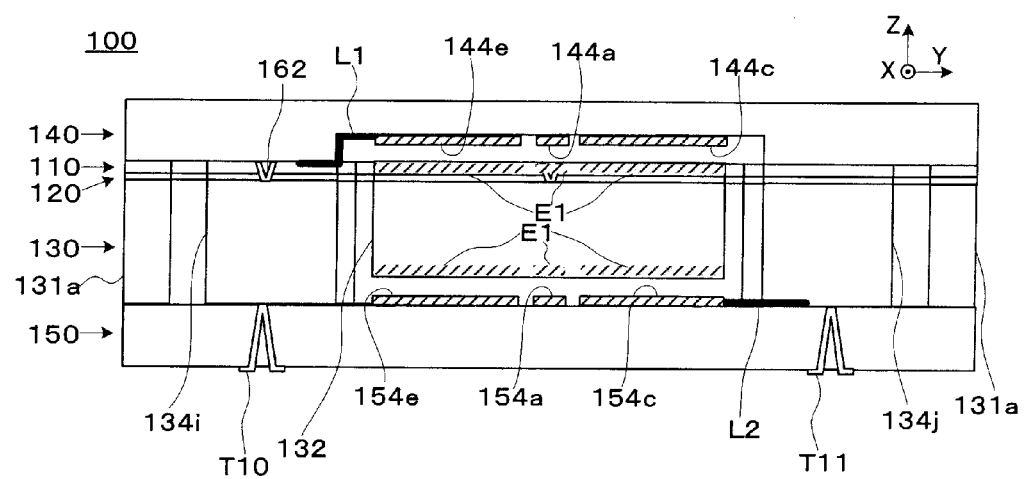
FIG. 11 is a cross-sectional view showing six pairs of capacitor elements in the mechanical quantity sensor shown in FIG. 9.

FIG. 11 is a cross-sectional view showing six pairs of capacitor elements in the mechanical quantity sensor 100 shown in FIG. 9. FIG. 11 shows a portion to function as an electrode by hatching. Note that although the six pairs of capacitor elements are shown in FIG. 11, ten pairs of capacitor elements are formed in the mechanical quantity sensor 100 as described above.

One electrodes of the ten pairs of capacitor elements are the driving electrodes 144a and the detection electrodes 144b to 144e formed on the first base 140, and the driving electrode 154a and the detection electrodes 154b to 154e formed on the second base 150.

The other electrodes are driving electrode E1 on the upper face of the displaceable portion 112a and detection electrodes E1 formed respectively on the upper faces of the displaceable portions 112b to 112e, driving electrodes E1 on a lower face of the weight portion 132a, and detection electrodes E1 formed on lower faces of the weight portions 132b to 132e, respectively. That is, a block made by joining the displaceable portion 112 and the weight portion 132 functions as a common electrode for ten pairs of capacitive couplings. Since the first structure 110 and the second structure 130 are formed of the conductive material (silicon containing impurities), the block made by joining the displaceable portion 112 and the weight portion 132 can function as an electrode.

The capacitance of a capacitor is in inverse proportion to the distance between electrodes, and thus it is assumed that the driving electrodes E1 and the detection electrodes E1 are present on an upper face of the displaceable portion 112 and a lower face of the weight portion 132. That is, the driving electrodes E1 and the detection electrodes E1 are not formed as separate bodies on outer layers of the upper face of the displaceable portion 112 and the lower face of the weight portion 132. It is understood that the upper face of the displaceable portion 112 and the lower face of the weight portion 132 function as the driving electrodes E1 and the detection electrodes E1.

The driving electrodes 144a and the detection electrodes 144b to 144e formed on the first base 140 are electrically connected to the block upper layer portions 114i, 114b, 114e, 114f, 114a via the wiring layers L1, L4 to L7 in order respectively. Further, conduction between the block upper layer portions 114i, 114b, 114e, 114f, 114a and the block lower layer portions 134i, 134b, 134e, 134f, 134a respectively is established by the conduction portion 162.

The driving electrode 154a and the detection electrodes 154b to 154e formed in the second base 150 are electrically connected to the block lower layer portions 134j, 134c, 134d, 134g, 134h via the wiring layers L2, L8 to L11 in order respectively.

Therefore, wirings to these driving electrodes 144a, 154a and detection electrodes 144b to 144e, 154b to 154e just need to be connected to lower faces of the block lower layer portions 134a to 134j. The wiring terminals T2 to T9 are arranged on the lower faces of the block lower layer portions 134a to 134h respectively, and the wiring terminals T10, T11 are arranged on the lower faces of the block lower layer portions 134i, 134j respectively.

Accordingly, the wiring terminals T2 to T11 are electrically connected to the detection electrodes 144e, 144b, 154b, 154c, 144c, 144d, 154d, 154e and the driving electrodes 144a, 154a in order respectively.

The driving electrodes E1 and the detection electrodes E1 are formed by the upper face of the displaceable portion 112 and the lower face of the weight portion 132, respectively. Conduction between the displaceable portion 112 and the weight portion 132 is established by the conduction portion 161, and they are both formed of a conductive material. Conduction between the pedestal 131 and the fixed portion 111 is established by the conduction portion 160, and they are both formed of a conductive material. The displaceable portion 112, the connection portion 113, and the fixed portion 111 are formed integrally of a conductive material. Therefore, wirings to the driving electrodes E1 and the detection electrodes E1 just need to be connected to a lower face of the pedestal 131. The wiring terminal T1 is arranged on a lower face of the projecting portion 131b of the pedestal 131, and the wiring terminal T1 is electrically connected to the driving electrodes E1 and the detection electrodes E1.

As described above, since the first structure 110 and the second structure 130 are formed of the conductive material (silicon containing impurities), the blocks a to j made by joining the block upper layer portions 114a to 114j and the block lower layer portions 134a to 134j can have a function as a wiring, and thus the wirings to the capacitor elements can be simplified.

The principle of detection of the acceleration and the angular velocity by the mechanical quantity sensor 100 will be described.

(1) Vibration of Displaceable Portion 112

When voltage is applied between the driving electrodes 144a, E1, the driving electrodes 144a, E1 attract each other by Coulomb force, and the displaceable portion 112 (and the weight portion 132) is displaced in the Z-axis positive direction. Further, when voltage is applied between the driving electrodes 154a, E1, the driving electrodes 154a, E1 attract each other by Coulomb force, and the displaceable portion 112 (and the weight portion 132) is displaced in the Z-axis negative direction. That is, by applying voltage between the driving electrodes 144a, E1 and between the driving electrodes 154a, E1 alternately, the displaceable portion 112 (and the weight portion 132) vibrates in the Z-axis direction. For this application of voltage, a positive or negative direct-current waveform (or pulsed waveform when non-application time is considered), a half-wave waveform, or the like can be used.

In addition, the driving electrodes 144a, E1 (the upper face of the displaceable portion 112a) and the driving electrodes 154a, E1 (the lower face of the weight portion 132a) function as a vibration applier, and the detection electrodes 144b to 144e, 154b to 154e, and E1 (the upper faces of the displaceable portions 112b to 112e, and the lower faces of the weight portions 132b to 132e) function as a displacement detector.

The cycle of vibration of the displaceable portion 112 is determined by a switching cycle of voltage. It is preferable that this cycle of switching is close to the natural frequency of the displaceable portion 112 to some degree. The natural frequency of the displaceable portion 112 is determined by an elastic force of the connection portion 113, the mass of the weight portion 132, and the like. When the cycle of vibration applied to the displaceable portion 112 does not correspond to the natural frequency, energy of the vibration applied to the displaceable portion 112 is dispersed, and the energy efficiency decreases.

In addition, alternating voltage with a ½ frequency of the natural frequency of the displaceable portion 212 may be applied only to either between the driving electrodes 144a, E1 or between the driving electrodes 154a, E1.

(2) Generation of Force Caused by Acceleration

When the acceleration a is applied to the weight portion 132 (displaceable portion 112), the force F0 acts on the weight portion 132. Specifically, according to the accelerations $\alpha x$, $\alpha y$, $\alpha z$ in the X, Y, Z-axis directions respectively, the forces $F0x$ ($=m \cdot \alpha x$), $F0y$ ($=m \cdot \alpha y$), $F0z$ ($=m \cdot \alpha z$) in the X, Y, Z-axis directions act on the weight portion 132 (m is the mass of the weight portion 132). As a result, slants in the X, Y directions and displacement in the Z direction occur in the displaceable portion 112. Thus, the accelerations $\alpha x$, $\alpha y$, $\alpha z$ cause the slants (displacements) in the displaceable portion 112 in the X, Y, Z directions.

(3) Generation of Coriolis Force Caused by Angular Velocity

When the weight portion 132 (displaceable portion 112) moves in the Z-axis direction at a velocity vz, application of the angular velocity $\omega$ causes a Coriolis force F to act on the weight portion 132. Specifically, according to the angular velocity $\omega x$ in the X-axis direction and the angular velocity $\omega y$ in the Y-axis direction respectively, Coriolis force Fy in the Y-axis direction ($=2 \cdot m \cdot vz \cdot \omega x$) and Coriolis force Fx ($=2 \cdot m \cdot vz \cdot \omega y$) in the X-axis direction act on the weight portion 132 (m is the mass of the weight portion 132).

When the Coriolis force Fy caused by the angular velocity $\omega x$ in the X-axis direction is applied, a slant in the Y direction occurs in the displaceable portion 112. Thus, slants (displacements) in the Y direction and X direction are generated in the displaceable portion 112 by Coriolis forces Fy, Fx caused by the angular velocities $\omega x$, $\omega y$.

(4) Detection of Displacement of the Displaceable Portion 112

As described above, a displacement (slant) of the displaceable portion 112 is caused by the acceleration $\alpha$ and the angular velocity $\omega$. The displacement of the displaceable portion 112 can be detected by the detection electrodes 144b to 144e, 154b to 154e.

When the force F0z in the Z positive direction is applied to the displaceable portion 112, distances between the detection electrodes E1 (the upper face of the displaceable portion 112c), 144c and between the detection electrodes E1 (the upper face of the displaceable portion 112e), 144e both become small. Consequently, capacitances between the detection electrodes E1 (the upper face of the displaceable portion 112c), 144c and between the detection electrodes E1 (the upper face of the displaceable portion 112e), 144e both become large. That is, based on the sum of capacitances between the detection electrodes E1 and the detection electrodes 144b to 144e (or the sum of capacitances between the detection electrodes E1 and the detection electrodes 154b to 154e), the displacement in the Z direction of the displaceable portion 112 can be detected and extracted as a detection signal.

On the other hand, when the force F0y or the Coriolis force Fy in the Y positive direction is applied to the displaceable portion 112, distances between the driving electrodes E1 (the upper face of the displaceable portion 112c), 144c and between the detection electrodes E1 (the lower face of the weight portion 132e), 154e become small, and distances between the detection electrodes E1 (the upper face of the displaceable portion 112e), 144e and the detection electrodes E1 (the lower face of the weight portion 132c), 154c become large. Consequently, capacitances between the detection electrodes E1 (the upper face of the displaceable portion 112c), 144c and between the detection electrodes E1 (the lower face of the weight portion 132e), 154e become large, and capacitances between the detection electrodes E1 (the upper face of the displaceable portion 112e), 144e and the detection electrodes E1 (the lower face of the weight portion 132c), 154c become small. That is, based on differences in capacitance between the detection electrodes E1 and the detection electrodes 144b to 144e, 154b to 154e, a change in slant in the X, Y direction of the displaceable portion 112 can be detected and extracted as a detection signal.

As described above, a slant in the X direction and the Y direction and a displacement in the Z direction of the displaceable portion 112 are detected by the detection electrodes E1, 144b to 144e, 154b to 154e.

(5) Extraction of Acceleration and Angular Velocity from Detection Signals

Signals outputted from the detection electrodes 144b to 144e, 154b to 154e, E1 include components caused by both the accelerations $\alpha x$, $\alpha y$, $\alpha z$ and the angular velocities $\omega x$, $\omega y$.

Using a difference between these components, the acceleration and the angular velocity can be extracted.

A force $F\alpha(=m\cdot a)$ of when an acceleration $\alpha$ is applied to the weight portion 132 (mass m) does not depend on vibration of the weight portion 132. Specifically, an acceleration component in a detection signal is a kind of bias component that does not correspond to vibration of the weight portion 132. On the other hand, a force $F\omega$ $(=2\cdot m\cdot vz\cdot w)$ of when the angular velocity $\omega$ is applied to the weight portion 132 (mass m) depends on the velocity vz in the Z-axis direction of the weight portion 132. That is, an angular velocity component in a detection signal is a kind of amplitude component that cyclically changes corresponding to vibration of the weight portion 132.

Specifically, the bias component (acceleration) with a frequency lower than a vibration frequency of the displaceable portion 112 and a vibration component (angular velocity) similar to the vibration frequency of the displaceable portion 112 are extracted by frequency analysis of the detection signal. Consequently, it becomes possible to measure the accelerations $\alpha x$, $\alpha y$, $\alpha z$ in the X, Y, Z directions (three axes) and the angular velocities $\alpha x$, $\alpha y$ in the X, Y directions (two axes) by the mechanical quantity sensor 100.

(Making of Mechanical Quantity Sensor 100)

Steps of making the mechanical quantity sensor 100 will be described.

Figure 12:
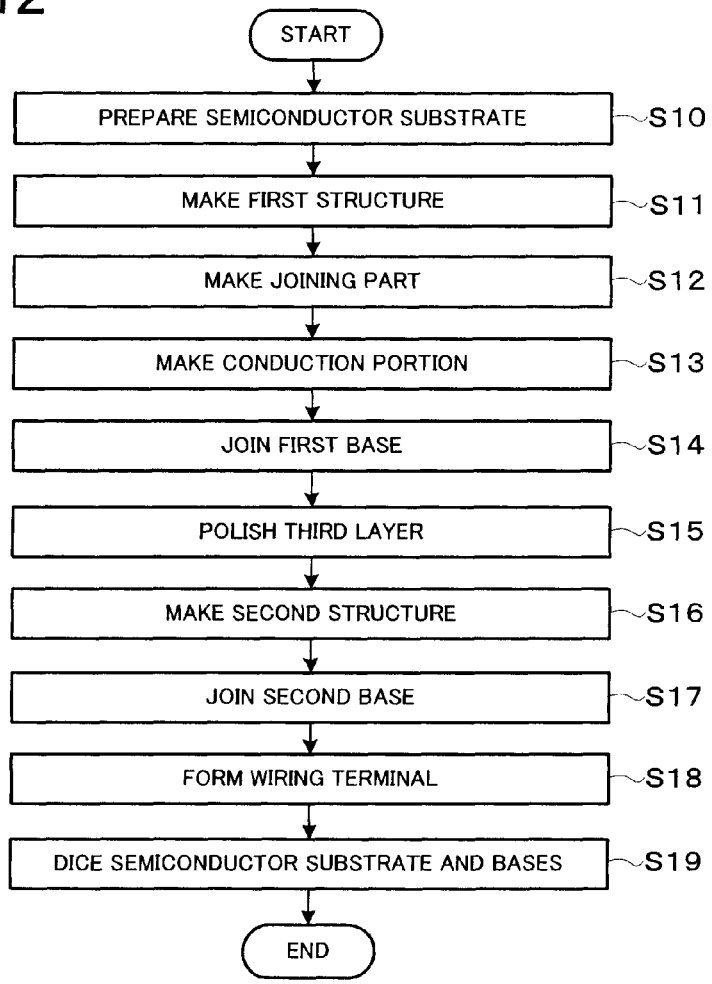
FIG. 12 is a flowchart showing an example of a making procedure of the mechanical quantity sensor according to the first embodiment of the present invention.

FIG. 12 is a flowchart showing an example of a making procedure of the mechanical quantity sensor 100. Further, FIG. 13A to FIG. 13K are cross-sectional views showing states of the mechanical quantity sensor 100 (corresponding to a cross section of the mechanical quantity sensor 100 taken along a line C-C in FIG. 10) during the making procedure in FIG. 12. FIG. 13A to FIG. 13K correspond to upside-down arrangements of the mechanical quantity sensor 100 of FIG. 10.

Figure 13A:
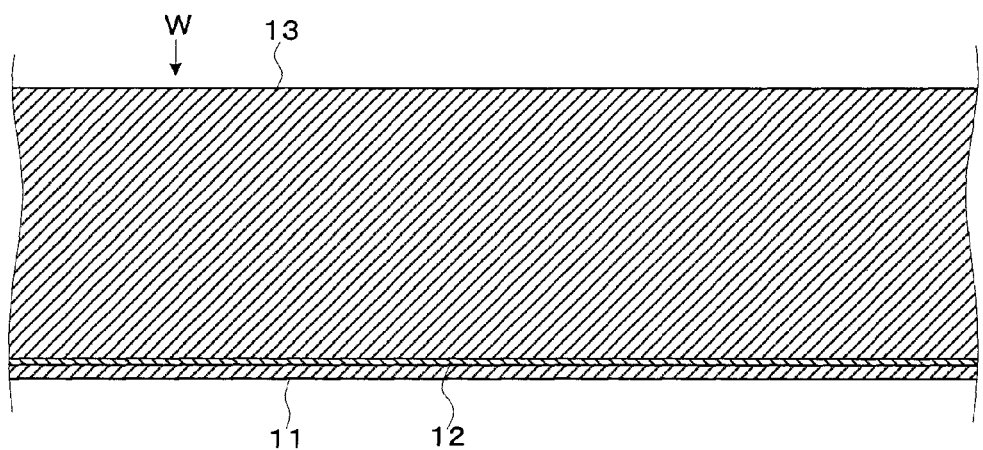
FIG. 13A is a cross-sectional view showing a state of the mechanical quantity sensor in the making procedure in FIG. 12.

(1) Preparation of Semiconductor Substrate W (Step S10, and FIG. 13A)

As shown in FIG. 13A, there is prepared a semiconductor substrate W formed by stacking three layers, first, second, and third layers 11, 12, 13.

The first, second, and third layers 11, 12, 13 are layers for forming the first structure 110, the joining part 120, the second structure 130 respectively, and here they are formed of silicon containing impurities, a silicon oxide, and silicon containing impurities.

The semiconductor substrate W having a stack structure of the three layers of silicon containing impurities/silicon oxide/silicon containing impurities can be made by joining a substrate obtained by stacking a silicon oxide film on a silicon substrate containing impurities and a silicon substrate containing impurities, and thereafter polishing the latter silicon substrate containing impurities to make it thin (what is called an SOI substrate).

Here, the silicon substrate containing impurities can be manufactured by, for example, doping impurities during manufacturing of a silicon single crystal by a Czochralski method. An example of the impurities contained in the silicon is boron. As the silicon containing boron, for example, one containing high-concentration boron and having resistivity of 0.001 $\Omega\cdot$cm to 0.01 $\Omega\cdot$cm can be used.

Note that here the first layer 11 and the third layer 13 are formed of the same material (silicon containing impurities), but the first, second, and third layers 11, 12, 13 may all be formed of different materials.

Figure 13B:
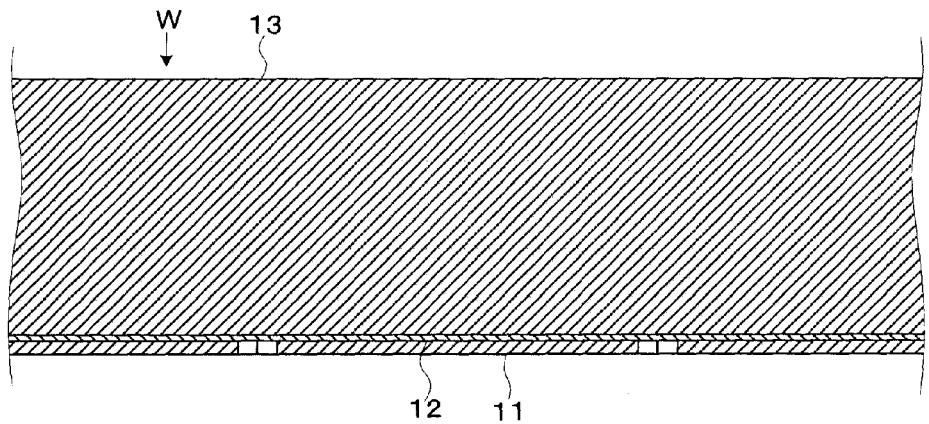
FIG. 13B is a cross-sectional view showing a state of the mechanical quantity sensor in the making procedure in FIG. 12.

(2) Making of First Structure 110 (Etching of First Layer 11, Step S11, and FIG. 13B)

The first layer 11 is etched to form an opening 115, and form the first structure 110. That is, using an etching method which can erode the first layer 11 but does not erode the second layer 12, predetermined areas (openings 115a to 115d) of the first layer 11 is etched in a thickness direction until an upper face of the second layer 12 is exposed.

A resist layer having a pattern corresponding to the first structure 110 is formed on an upper face of the first layer 11, and exposed portions not covered by this resist layer are eroded downward vertically. In this etching step, the second layer 12 is not eroded, and only the predetermined areas (openings 115a to 115d) of the first layer 11 are removed. FIG. 13B shows a state that the first layer 11 is etched as described above to form the first structure 110.

Figure 13C:
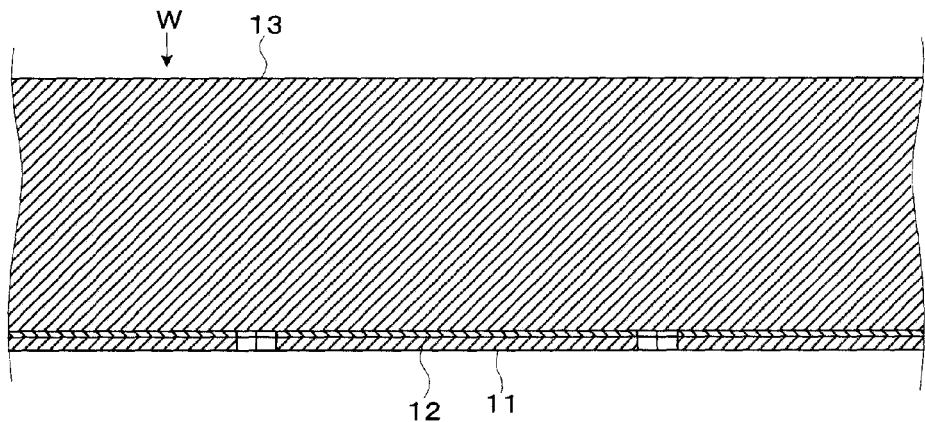
FIG. 13C is a cross-sectional view showing a state of the mechanical quantity sensor in the making procedure in FIG. 12.

(3) Making of Joining Part 120 (Etching of Second Layer 12, Step S12, and FIG. 13C)

The second layer 12 is etched to thereby form the joining part 120. Specifically, the second layer 12 is etched from its exposed portions in the thickness direction and a layer direction, by an etching method which can erode the second layer 12 but does not erode the first layer 11 and the third layer 13.

In this etching step, it is unnecessary to form a resist layer separately. That is, the first structure 110 being a residue portion of the first layer 11 functions as a resist layer for the second layer 12. The etching is performed on an exposed portion of the second layer 12.

In the etching step (Step S12) on the second layer 12, it is necessary to perform an etching method that satisfies the following two conditions. The first condition is to have directions in the thickness direction as well as the layer direction. The second condition is that it can erode a silicon oxide layer but cannot erode a silicon layer.

The first condition is a condition necessary for not allowing the silicon oxide layer to remain on an unnecessary portion and inhibit freedom of displacement of the weight portion 132. The second condition is a condition necessary for not allowing the erosion to reach the first structure 110, on which processing to make a predetermined shape is already completed, and the third layer 13, which are formed of silicon.

As an etching method that satisfies the first and second conditions, there is wet etching using buffered hydrofluoric acid (for example, a mixed aqueous solution of HF=5.5 wt %, $NH_4F$=20 wt %) as an etching solution. Further, dry etching by an RIE method using a mixed gas of $CF_4$ gas and $O_2$ gas is also applicable.

Figure 13D:
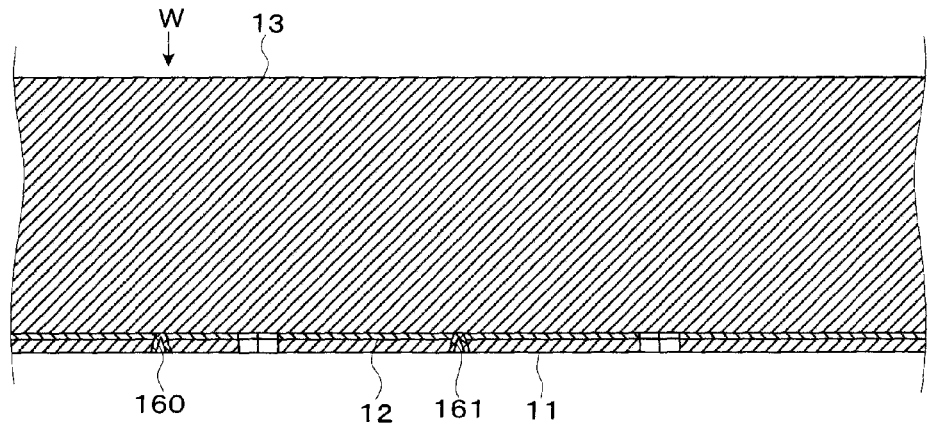
FIG. 13D is a cross-sectional view showing a state of the mechanical quantity sensor in the making procedure in FIG. 12.

(4) Formation of Conduction Portions 160 to 162 (Step S13, and FIG. 13D)

The conduction portions 160 to 162 are formed as a, b below.

a. Formation of Conical Through Holes

Predetermined positions of the first structure 110 and the second layer 12 are wet etched, and weight-shaped through holes penetrating up to the second layer 12 are formed. As the etching solution, a 20% TMAH (tetramethylammonium hydroxide) can be used for example to etch the first structure 110, and buffered hydrofluoric acid (for example, a mixed aqueous solution of HF=5.5 wt %, $NH_4F$=20 wt %) can be used for example to etch the second layer 12.

b. Formation of Metal Layers

On the upper face of the first structure 110 and in the conical through holes, Al for example is deposited by a vapor deposition method, a sputtering method, or the like, so as to form the conduction portions 160 to 162. Unnecessary metal layers (metal layers outside edges (not shown) of upper ends of the conduction portions 160 to 162) deposited on the upper face of the first structure 110 are removed by etching.

(5) Joining of First Base 140 (Step S14 and FIG. 13E)
1) Making of First Base 140

A substrate formed of an insulative material (for example, a glass substrate containing mobile ions) is etched to form the recessed portion 143, and then the driving electrode 144a, the detection electrodes 144b to 244e, and the wiring layers L1, L4 to L7 are formed at predetermined positions by a pattern formed of Al containing Nd for example. Here, the reason that the glass substrate contains mobile ions is for anodic bonding thereafter.

2) Joining of Semiconductor Substrate W and First Base 140

The semiconductor substrate W and the first base 140 are joined by anodic bonding for example.

Figure 13E:
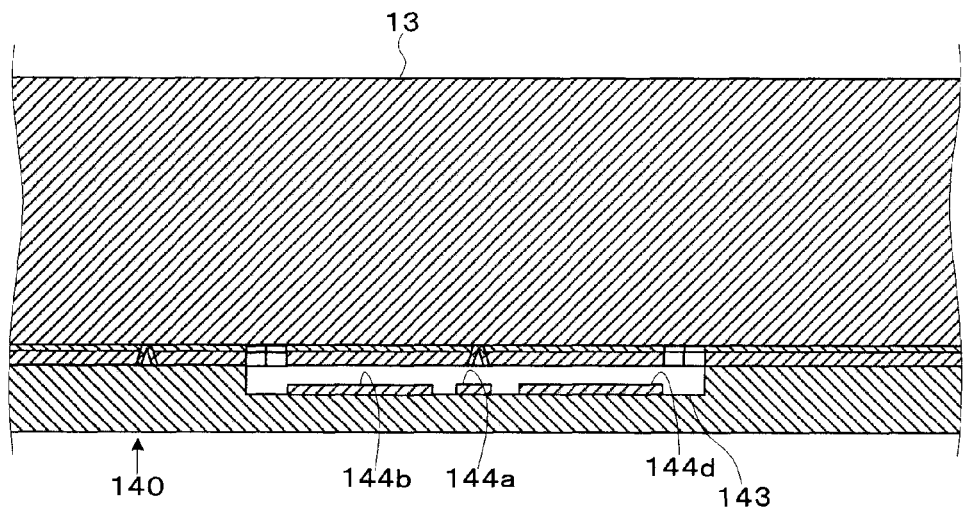
FIG. 13E is a cross-sectional view showing a state of the mechanical quantity sensor in the making procedure in FIG. 12.

The first base 140 is anodically bonded before making the second structure 130. Since the first base 140 is anodically bonded before forming the weight portion 132, no thin area exists in the connection portions 113a to 113d, and thus they do not have flexibility. Thus, the displaceable portion 112 is not attracted to the first base 140 when electrostatic attraction occurs. Accordingly, joining of the first base 140 and the displaceable portion 112 can be prevented. FIG. 13E shows a state that the semiconductor substrate W and the first base 140 are joined.

Figure 13F:
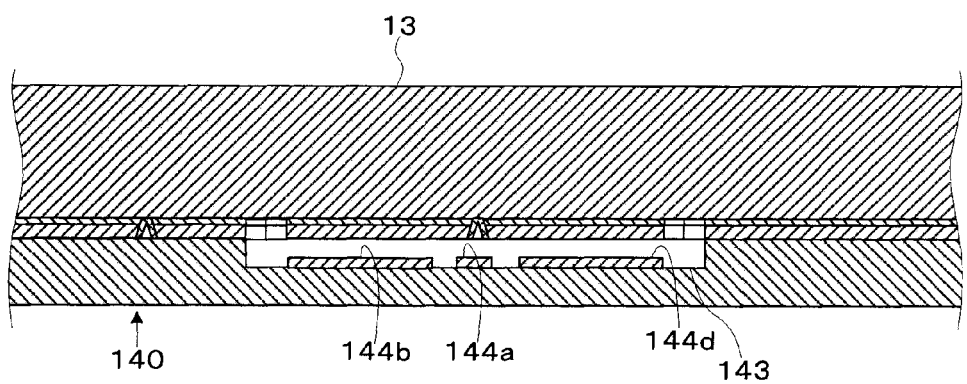
FIG. 13F is a cross-sectional view showing a state of the mechanical quantity sensor in the making procedure in FIG. 12.

(6) Polishing Third Layer 13 (Step S15 and FIG. 13F)

By CMP (chemical mechanical polishing) for example, an upper face of the third layer 13 is polished so that the third layer 13 has a predetermined thickness. The thickness of the third layer 13 after polishing can be set appropriately according to the specification of mechanical properties demanded for the mechanical quantity sensor 100.

Note that polishing of the third layer 13 (Step S15) may be performed after making the first structure 130 (Step S11), after making the joining part 120 (Step S12), or after making the conduction portions 160 to 162 (Step S13). However, it is preferable that polishing of the third layer 13 (Step S15) is performed after joining the first base (Step S14) as in this embodiment. This making procedure allows the first base 140 to function as a support plate for the semiconductor substrate W, and the semiconductor substrate W can be made thinner than conventional ones (which will be described later). Thus, reduction in thickness of the entire mechanical quantity sensor 100 is easy, and freedom of designing the mechanical quantity sensor 100 can be increased.

Since the manufacturing method of the mechanical quantity sensor 100 of this embodiment has Step S15 (polishing the third layer 13), it is possible to choose a semiconductor substrate W having a certain thickness or more (the third layer 13 is larger in thickness than the weight portion 132) irrespective of the specification of mechanical properties such as a resonant frequency. Thus, according to this embodiment, it is possible to improve freedom of choice of the thickness of the semiconductor substrate W prepared for manufacturing the mechanical quantity sensor 100. This makes it possible to prepare plural semiconductor substrate W having same thicknesses and produce several types of mechanical quantity sensors 100 which are different in specification of mechanical properties.

Further, since the manufacturing method of the mechanical quantity sensor 100 of this embodiment has Step S15 (polishing the third layer 13), it is possible to make and stock semi-manufactured products (products in the middle of the manufacturing process before reaching final products) for the mechanical quantity sensor 100, irrespective of the specification of demanded mechanical properties such as a resonance frequency.

This is because the thickness of the weight portion 132 affecting the mechanical properties can be adjusted in Step S15 by polishing the third layer 13 of a semi-manufactured product (for example, the semiconductor substrate W joined to the first base 140), and thus the mechanical quantity sensor 100 with the specification of demanded mechanical properties can be produced from the semi-manufactured product.

Here, the semi-manufactured product to be made and stocked can be the semiconductor substrate W in which the first structure 110 is formed in Step S11, the semiconductor substrate W in which the joining part 120 is formed in Step S12, the semiconductor substrate W in which the conduction portions 160 to 162 are formed in Step S13, or the semiconductor substrate W which is joined to the first base 140 in Step S14. Among them, in light of protection of the first structure 110, the semiconductor substrate W joined to the first base 140 is preferable.

Thus, according to this embodiment, since the same semi-manufactured products can be made and stocked irrespective of the specification of mechanical properties of the final product (mechanical quantity sensor 100), mass-production effect thereof enables to reduce the manufacturing cost of the mechanical quantity sensor 100.

Further, since the manufacturing method of the mechanical quantity sensor 100 of this embodiment has Step S15 (polishing the third layer 13), reduction in thickness of the semiconductor substrate W is easy, and the entire mechanical quantity sensor 100 can be made thinner than conventional ones. This is because thinning processing is performed in Step S15 by polishing the semiconductor substrate W to which the first base 140 is joined, and thus the first base 140 functions as a support plate for the semiconductor substrate W.

Since the first base 140 functions as a support plate for the semiconductor substrate W, there is less fear of damaging the semiconductor substrate when joining a semiconductor substrate (not joined to a base such as a glass substrate) after thinning processing to a base such as a glass substrate or when handling, as in conventional techniques. Further, there is no fear of decreasing the processing accuracy due to a reason such that a semiconductor substrate (not joined to a base such as a glass substrate) after thinning processing is bent and alignment marks are displaced, or the like, as in prior arts.

Thus, according to this embodiment, thinning processing is performed by polishing the semiconductor substrate W to which the first base 140 is joined, damaging or bending the semiconductor substrate W can be suppressed. Accordingly, the semiconductor substrate W can be easily thinned to about 50 μm for example, which has been difficult conventionally, and the entire mechanical quantity sensor 100 can be reduced in thickness more than in conventional ones.

Further, according to this embodiment, it is possible in Step S15 (polishing the third layer 13) to thin down the third layer 13 to make the thickness of the weight portion 132 smaller than in conventional ones, and thus freedom of designing the mechanical quantity sensor 100 can be increased.

Figure 13G:
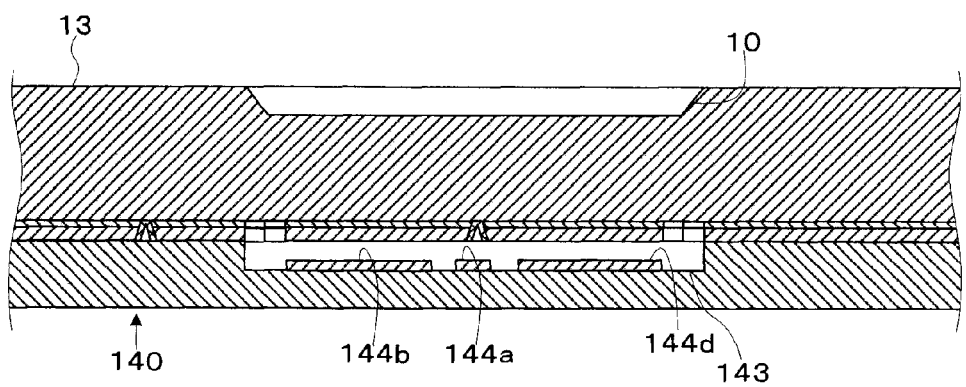
FIG. 13G is a cross-sectional view showing a state of the mechanical quantity sensor in the making procedure in FIG. 12.
Figure 13H:
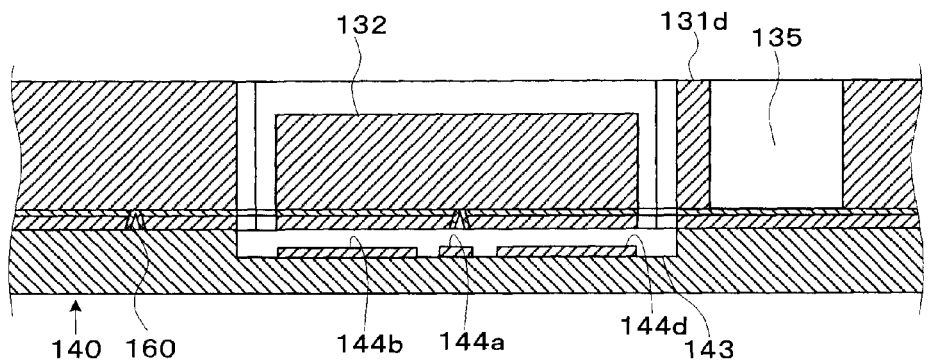
FIG. 13H is a cross-sectional view showing a state of the mechanical quantity sensor in the making procedure in FIG. 12.

(7) Making of Second Structure 130 (Etching Third Layer 13, Step S16, and FIG. 13G, FIG. 13H)

The second structure 130 is formed as a, b below.
a. Formation of Gap 10 (FIG. 13G)

On the upper face of the third layer 13 polished to a predetermined thickness excluding the formation area for the weight portion 132 and its vicinity, a resist layer is formed, and an exposed portion (formation area for the weight portion 132 and its vicinity) not covered by this resist layer is eroded downward vertically. As a result, the gap 10 for allowing the weight portion 132 to be displaced is formed above the area where the weight portion is to be formed.

b. Formation of Second Structure 130 (FIG. 13H)

The third layer 13 in which the gap 10 is formed is etched to form the opening 133, the block lower layer portions 134a to 134j, and the pocket 135, thereby forming the second structure 130. Specifically, a predetermined area (opening 133) of the third layer 13 is etched in the thickness direction by an etching method that erodes the third layer 13 and does not erode the second layer 12.

A resist layer having a pattern corresponding to the second structure 130 is formed on the upper face of the third layer 13, and an exposed portion not covered by this resist layer is eroded downward vertically. FIG. 13H shows a state that the second structure 130 is formed by etching the third layer 13 as described above.

In the above manufacturing process, it is necessary to perform an etching method as follows in the step of forming the first structure 110 (Step S11), and the step of forming the second structure 130 (Step S16).

A first condition is to have directions in the thickness direction of each layer. A second condition is that it erodes a silicon layer but does not erode a silicon oxide layer.

An etching method satisfying the first condition is ICP etching method (Induced Coupling Plasma Etching Method). This etching method is effective for opening a deep trench in a vertical direction, and is a kind of etching method that is generally called DRIE (Deep Reactive Ion Etching).

In this method, an etching stage of digging while eroding a material layer in a thickness direction and a deposition stage of forming a polymer wall on a side face of the dug hole are repeated alternately. The side face of the dug hole is protected by a polymer wall that is formed sequentially, and thus it becomes possible to allow the erosion to proceed almost only in the thickness direction.

On the other hand, to perform etching satisfying the second condition, an etching material having etching selectivity between a silicon oxide and silicon may be used. For example, it is conceivable to use a mixed gas of $SF_6$ gas and $O_2$ gas in the etching stage, and use a $C_4F_8$ gas in the deposition stage.

Figure 13I:
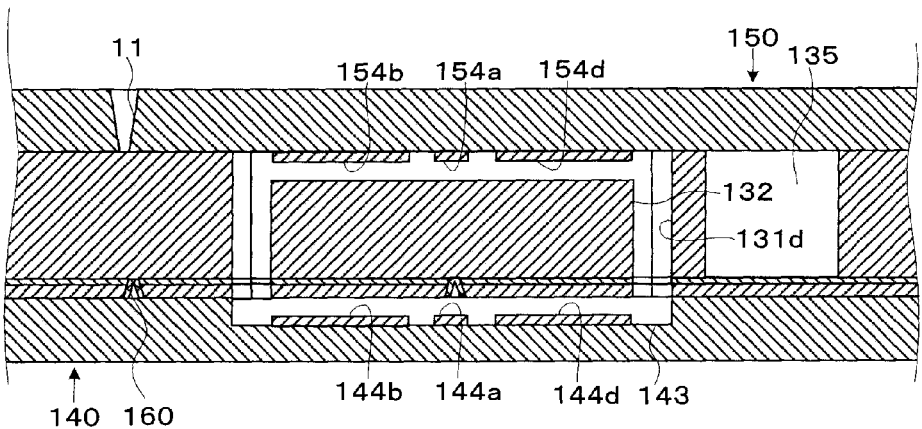
FIG. 13I is a cross-sectional view showing a state of the mechanical quantity sensor in the making procedure in FIG. 12.

(8) Joining of Second Base 150 (Step S17, and FIG. 13I)

1) Formation of Second Base 150.

In a substrate formed of an insulating material (for example, a glass substrate containing movable ions), the driving electrode 154a, the detection electrode 154b to 154e, and the wiring layers L2, L8 to L11 are formed at predetermined positions with a pattern formed of Al containing Nd for example. Further, the second base 150 is etched to form 11 truncated conical through holes 10 for forming the wiring terminals T1 to T11 at predetermined positions. Here, the reason that the glass substrate includes movable ions is for anodic joining thereafter.

Incidentally, prior to forming the driving electrode 154 and so on, a recess portion may be formed in the second base 150 by etching or the like, similarly to the first base 140. In this way, formation of the gap 10 in the second structure 130 becomes unnecessary. That is, the gap between the weight portion 132 and the second base 150 can be provided in either the second structure 130 or the second base 150, or in both of them.

2) Joining of Semiconductor Substrate W and Second Base 150

A getter material (made by SAES Getters Japan, product name: Non-evaporable Getter) is put in the pocket 135, and the second base 150 and the semiconductor substrate W are joined by anodic bonding for example. FIG. 13I shows a state that the semiconductor substrate W and the second base 150 are joined.

In addition, the upper face of the first base 140 and/or the lower face of the second base 150, shown in FIG. 13I, can be polished by a polishing method for example, so as to thin down the first base 140 and/or the second base 150, thereby making the entire mechanical quantity sensor 100 thinner than conventional ones. Thus, the total thickness of the semiconductor substrate W, the first base 140, and the second base 150 (thickness of the mechanical quantity sensor 100 as the final product) can be, for example, 1000 μm (for example, the thickness 400 μm of the semiconductor substrate W, the thickness 300 μm of the first base 140, and the thickness 300 μm of the second base 150). This is because, due to the semiconductor substrate W, the first base 140, and the second base 150 being stacked together, the semiconductor substrate W and the second base 150 function as a support plate when polishing the first base 140, and the semiconductor substrate W and the first base 140 function as a support plate when polishing the second base 150.

Figure 13J:
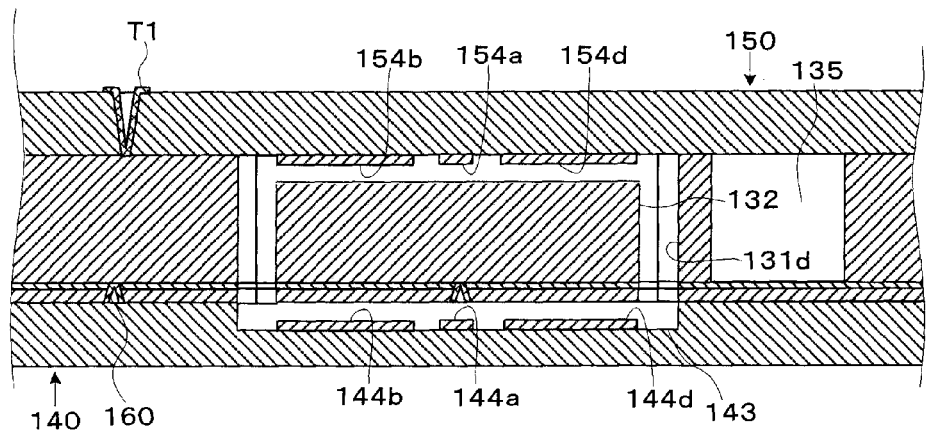
FIG. 13J is a cross-sectional view showing a state of the mechanical quantity sensor in the making procedure in FIG. 12.

(9) Formation of the Wiring Terminals T1 to T11 (Step S18 and FIG. 13J)

Metal layers, for example, a Cr layer and an Au layer are formed in this order by a vapor deposition method, a sputtering method, or the like on the upper face of the second base 150 and in the conical through holes 10. Unnecessary metal layers (metal layers outside edges of upper ends of the wiring terminals T) are removed by etching, thereby forming the wiring terminals T1 to T11.

Figure 13K:
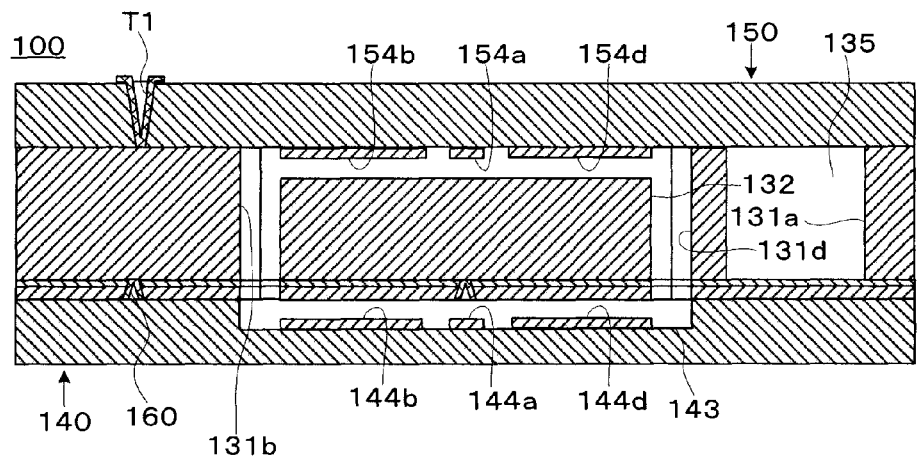
FIG. 13K is a cross-sectional view showing a state of the mechanical quantity sensor in the making procedure in FIG. 12.

(10) Dicing of Semiconductor Substrate W, First Base 140, and Second Base 150 (Step S19 and FIG. 13K)

The getter material in the pocket 135 is activated by, for example, heat treatment at 450° C., and thereafter the semiconductor substrate W, the first base 140, and the second base 150 joined together are cut by a dicing saw or the like, to thereby separate them into individual mechanical quantity sensors 100.

As above, according to this embodiment, since the method has Step S15 (polishing the third layer 13), a semiconductor substrate W having a certain thickness or more (the third layer 13 is larger in thickness than the weight portion 132) can be selected irrespective of the specification of mechanical properties such as a resonance frequency. Accordingly, this embodiment allows to improve freedom of choice of thickness of the semiconductor substrate W prepared for manufacturing the mechanical quantity sensor 100. Thus, plural semiconductor substrates W with the same thicknesses can be prepared for manufacturing several kinds of mechanical quantity sensors 100 which are different in specification of mechanical properties.

Further, this embodiment allows to make and stock semi-manufactured products for the mechanical quantity sensor 100, irrespective of the specification of mechanical properties such as a resonance frequency. This is because it is possible to adjust the thickness of the weight portion 132 affecting the mechanical properties by polishing the third layer 13 of the semi-manufactured product (for example, the semiconductor substrate W joined to the first base 140) in Step S15, and thus the mechanical quantity sensor 100 with the specification of demanded mechanical properties can be produced from the semi-manufactured products. Since the same semi-manufactured products can thus be made and stocked irrespective of the specification of mechanical properties of the final product (mechanical quantity sensor 100), mass-production effect thereof enables to reduce the manufacturing cost of the mechanical quantity sensor 100.

Further, according to this embodiment, since the method has Step S15 (polishing of the third layer 13), reduction in thickness of the semiconductor substrate W is easy, and consequently, the entire mechanical quantity sensor 100 can be made thinner as conventional ones. Since thinning processing is performed in Step S15 by polishing the semiconductor substrate W to which the first base 140 is joined, the first base 140 functions as the support plate for the semiconductor substrate W, and bending and damaging the semiconductor substrate, which has been problems conventionally, can be suppressed.

Further, in this embodiment, thinning processing is performed by polishing the semiconductor substrate W to which the first base 140 is joined in Step S15 (polishing the third layer 13), thinning of the weight portion 132 is possible more than in conventional manners, and freedom of designing the mechanical quantity sensor 100 can be increased.

Second Embodiment

Figure 14:
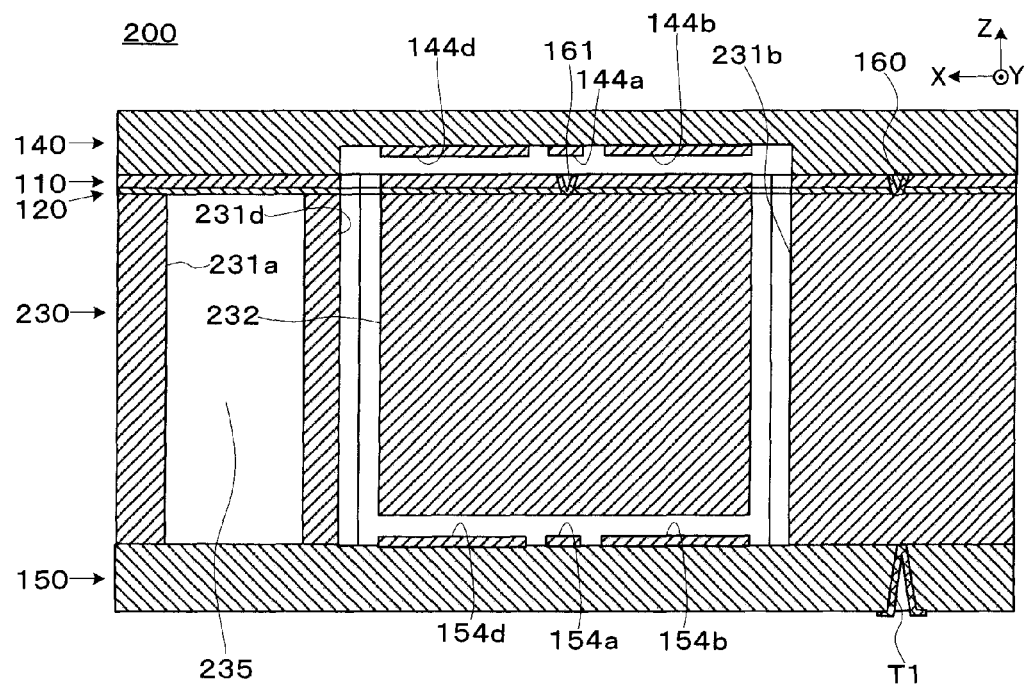
FIG. 14 is a partial cross-sectional view showing a main part of the mechanical quantity sensor according to a second embodiment of the present invention.

FIG. 14 is a partial cross-sectional view showing a main part of a mechanical quantity sensor 200 according to a second embodiment of the present invention. Parts common to FIG. 10 are given the same reference numerals, and overlapping description is omitted.

As shown in FIG. 14, the mechanical quantity sensor 200 of this embodiment is different from the mechanical quantity sensor 100 of the first embodiment in method of adjusting (and as its consequence the thickness of) the second structure (second structures 130, 230). Specifically, the mechanical quantity sensor 100 of the first embodiment has the second structure 130 which is adjusted to be smaller in thickness after the first base 140 and the first structure 110 are joined and before the second base 150 and the second structure 130 are joined. In comparison, the mechanical quantity sensor 200 of this embodiment has a second structure 230 which is adjusted to be larger in thickness after a first base 140 and a first structure 110 are joined and before a second base 150 and the second structure 230 are joined.

A structure of the mechanical quantity sensor 200 will be described. The mechanical quantity sensor 200 has a first structure 110, a joining part 120, a second structure 230, a first base 140, and a second base 150, which are arranged by stacking one another.

The second structure 230 is formed by pedestal 231 (231a to 231d), a weight portion 232 (232a to 232e), and a block lower layer portion 234 (234a to 234j). In a projection portion 231d of the pedestal 231, a pocket 235 is formed.

The second structure 230 included in the mechanical quantity sensor 200 of this embodiment is different from the first structure 130 included in the mechanical quantity sensor 100 of the first embodiment only in that it is adjusted to be large in thickness.

Examples of a method of adjusting the thickness of the second structure 230 (and as its consequence a method of adjusting the thickness of the weight portion 232) include thickening by forming a semiconductor layer (for example an epitaxial layer) on a semiconductor material layer in the area where the weight portion 232 is formed, and thickening by joining a semiconductor layer to a semiconductor material layer in the area where the weight portion 232 is formed.

The weight portion 232 is formed by adjusting the thickness of the semiconductor material in the formation area of the weight portion 232 to be larger, in the middle of the manufacturing process, specifically, after the first structure 110 is formed and before the second base 150 and the second structure 230 are joined.

The thickness of the weight portion 232 is not limited particularly, and can be set appropriately according to the specification of mechanical properties demanded for the mechanical quantity sensor 200. The thickness of the weight portion 232 can be adjusted to, for example, 700 μm.

Figure 15:
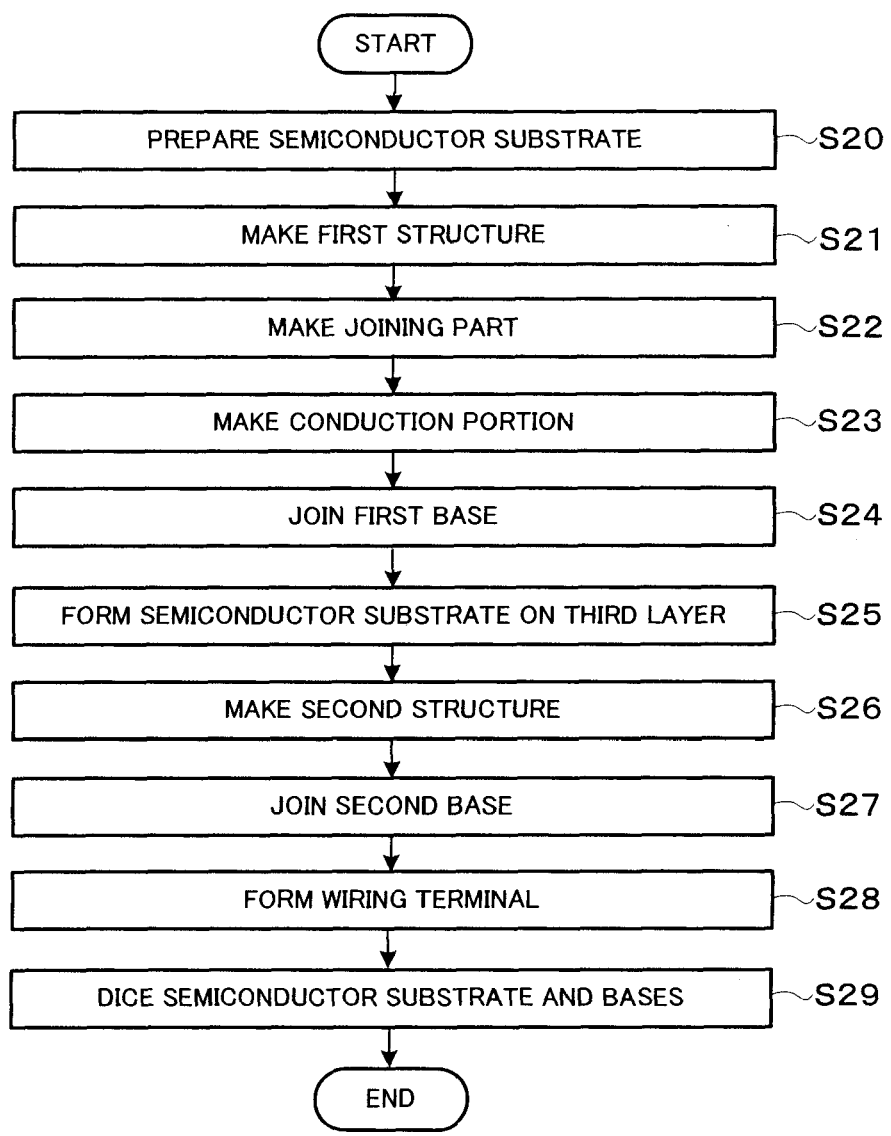
FIG. 15 is a flowchart showing an example of a making procedure of the mechanical quantity sensor according to the second embodiment of the present invention.

Steps of making the mechanical quantity sensor 200 will be described. FIG. 15 is a flowchart showing an example of a making procedure of the mechanical quantity sensor 200.

As shown in FIG. 15, this embodiment is different in that, instead of polishing the third layer 13 in Step S15 in the method of making the mechanical quantity sensor 100 of the first embodiment, a semiconductor layer is formed on a third layer in Step S25.

Examples of formation of the semiconductor layer include forming an epitaxial layer and joining a semiconductor layer. Examples of joining methods of the semiconductor layer include publicly known joining methods such as a wafer direct joining method and a surface activation joining method.

Note that forming the semiconductor layer on the third layer (Step S25) may be performed after making the first structure 130 (Step S21), after making the joining part 120 (Step S22), or after making the conduction portions 160 to 162 (Step S23).

As above, according to this embodiment, since the method has Step S25 (forming the semiconductor layer on the third layer), it is possible to select a semiconductor substrate W having a certain thickness or smaller (thickness of the third layer is equal to or smaller than the thickness of the weight portion 232) irrespective of the specification of mechanical properties such as a resonant frequency. Thus, this embodiment allows to improve freedom of choice of thickness of the semiconductor substrate W prepared for manufacturing the mechanical quantity sensor 200. Accordingly, it is possible to prepare plural semiconductor substrates W having the same thicknesses and manufacture several kinds of mechanical quantity sensors 200 which are different in specification of mechanical properties. Further, it is possible to prepare plural semiconductor substrates W having the same thicknesses and manufacture the mechanical quantity sensor 200 (in which the weight portion 232 is thickened) and the mechanical quantity sensor 100 (in which the weight portion 132 is thinned).

Further, this embodiment allows to make and stock semi-manufactured products for the mechanical quantity sensor 200, irrespective of the specification of mechanical properties such as a resonance frequency. This is because it is possible to adjust the thickness of the weight portion 232 affecting the mechanical properties by forming a semiconductor layer on the third layer of the semi-manufactured product (for example, the semiconductor substrate W joined to the first base 140) in Step S25, and thus the mechanical quantity sensor 200 with the specification of demanded mechanical properties can be manufactured from the semi-manufactured products. Since the same semi-manufactured products can thus be made and stocked irrespective of the specification of mechanical properties of the final product (mechanical quantity sensor 200), mass-production effect thereof enables to reduce the manufacturing cost of the mechanical quantity sensor 200.

In addition, it is possible that the semi-manufactured products for the mechanical quantity sensor 200 (this embodiment) and the semi-manufactured products for the mechanical quantity sensor 100 (first embodiment) are the same ones (for example, the semiconductor substrate W joined to the first base 140). This enables to further reduce the manufacturing cost of the mechanical quantity sensors 100, 200 by further mass production effect.

Moreover, according to this embodiment, sometimes it is easier to thicken the weight portion 232 than in conventional ones because the semiconductor substrate W to which the first base 140 is joined is thickened in Step S25 (forming the semiconductor layer on the third layer). This is because, for example, even when it is difficult to manufacture such SOI substrates by a generally used conventional manufacturing apparatus for SOI substrates since the third layer is large in thickness, this embodiment allows to easily manufacture the mechanical quantity sensor 200 with the weight portion 232 having such a large thickness (for example, the weight portion 232 having a thickness of 900 μm). Thus, this embodiment allows to increase freedom of designing the mechanical quantity sensor 200.

Other Embodiments

Embodiments of the present invention are not limited to the above-described embodiments and can be extended and modified. Extended and modified embodiments are included in the technical scope of the present invention.

Further, the mechanical quantity sensors 100, 200 are described with examples of using a conductive material (silicon containing impurities) for the first structure 110 and the second structures 130, 230, but it is not always necessary that the entire body is formed of the conductive material. It may be arranged that at least necessary parts, such as the driving electrodes E1, the detection electrodes E1, parts establishing conduction between the wiring terminals T10 and the lower faces of the block lower layer portions 134*i*, and the like, are formed of the conductive material.

What is claimed is:

1. A method of manufacturing a mechanical quantity sensor, comprising:
    providing a semiconductor substrate, the semiconductor substrate comprising:
        a first layer of a first semiconductor material;
        a second layer of an insulating material; and
        a third layer of a second semiconductor material;
    forming a first structure by etching the first layer, the first structure comprising:
        a fixed portion with an opening,
        a displaceable portion arranged in the opening and displaceable relative to the fixed portion, and
        a connection portion connecting the fixed portion and the displaceable portion,
    adjusting a thickness of the entire third layer and
    forming a second structure by etching the adjusted third layer, the second structure comprising;
        a weight portion connected to the displaceable portion, and
        a pedestal arranged surrounding the weight portion and connected to the fixed portion.

2. The method of manufacturing the mechanical quantity sensor according to claim 1, further comprising,
    between the forming the first structure and the adjusting the thickness of the third layer, joining a first base formed of an insulating material to the fixed portion and arranging and stacking the first base on the first structure.

3. The method of manufacturing the mechanical quantity sensor according to claim 1, further comprising:
    joining a second base formed of an insulating material to the pedestal and arranging and stacking the second base on the second structure.

4. The method of manufacturing the mechanical quantity sensor according to claim 1,
    wherein the adjusting the thickness of the third layer comprises polishing the third layer.

5. The method of manufacturing the mechanical quantity sensor according to claim 1,
    wherein the adjusting the thickness of the third layer comprises forming a semiconductor layer on the third layer.

6. The method of manufacturing the mechanical quantity sensor according to claim 1,
    wherein the adjusting the thickness of the third layer comprises joining a semiconductor layer to the third layer.

7. The method of manufacturing the mechanical quantity sensor according to claim 1,
    wherein forming the second structure comprises forming the second structure with a weight portion comprising a first portion, a second portion, a third portion, a fourth portion, and a fifth portion, and
    wherein the second, third, fourth, and fifth portions are connected to the first portion from four directions, respectively.

8. The method of manufacturing the mechanical quantity sensor according to claim 1,
    wherein forming the second structure comprises forming the second structure with a weight portion having a thickness of at least 50 microns.

* * * * *